(12) United States Patent
Nimura et al.

(10) Patent No.: US 7,084,940 B2
(45) Date of Patent: Aug. 1, 2006

(54) ELECTRO-OPTIC DEVICE COMPRISING A RECESS/PROJECTION PATTERN OBTAINED BY ROTATING A REFERENCE PATTERN ABOUT A PREDETERMINED POSITION

(75) Inventors: Toru Nimura, Suwa (JP); Shin Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 10/671,451

(22) Filed: Sep. 29, 2003

(65) Prior Publication Data

US 2004/0141136 A1 Jul. 22, 2004

(30) Foreign Application Priority Data

Sep. 30, 2002 (JP) ............... 2002-286136
Mar. 13, 2003 (JP) ............... 2003-068322

(51) Int. Cl.
*G02F 1/1343* (2006.01)
(52) U.S. Cl. .................. 349/113; 349/144
(58) Field of Classification Search ........ 349/113–115, 349/144
See application file for complete search history.

(56) References Cited

U.S. PATENT DOCUMENTS 6,313,895 B1 * 11/2001 Tsuda et al. ............. 349/113
6,452,653 B1    9/2002 Yamanaka et al.
6,747,718 B1 *  6/2004 Kanou et al. ............. 349/113

FOREIGN PATENT DOCUMENTS

| | | |
|---|---|---|
| JP | A-11-337935 | 12/1999 |
| JP | A-2000-221494 | 8/2000 |
| JP | A-2000-284272 | 10/2000 |
| JP | A-2001-083538 | 3/2001 |
| JP | A-2001-141915 | 5/2001 |
| JP | A-2001-154189 | 6/2001 |
| JP | A-2001-194662 | 7/2001 |
| JP | A-2001-201742 | 7/2001 |
| JP | A-2001-215529 | 8/2001 |
| JP | A-2002-014211 | 1/2002 |
| JP | A-2002-196322 | 7/2002 |
| JP | A-2002-207214 | 7/2002 |
| JP | A-2002-214641 | 7/2002 |
| JP | A-2002-244126 | 8/2002 |
| JP | A-2002-258278 | 9/2002 |
| JP | A-2003-149662 | 5/2003 |
| KR | A-2001-0074545 | 8/2001 |
| KR | A-2001-0082507 | 8/2001 |

* cited by examiner

*Primary Examiner*—Dung T. Nguyen
*Assistant Examiner*—Thoi V. Duong
(74) *Attorney, Agent, or Firm*—Oliff & Berridge, PLC

(57) ABSTRACT

An electro-optic device is provided that is capable of preventing an interference of reflected lights from a light reflecting film and avoiding the occurrence of glare and chrominance non-uniformity among pixels, and an electronic apparatus using the electro-optic device. In a TFT array substrate of a reflective or transflective electro-optic device, a lower-side recess/projection forming film 13a, is formed in each of pixels 100a in the form of a matrix pattern so that a recess/projection pattern to scatter light is formed on the surface of a light reflecting film. The pixels are grouped into a plurality of units, each including a plurality of pixels, and the recess/projection pattern is formed to provide a different pattern for each pixel at least in each of the units. Different recess/projection patterns are obtained, for example, by rotating the recess/projection pattern for a pixel as a reference.

20 Claims, 20 Drawing Sheets

Fig. 11A
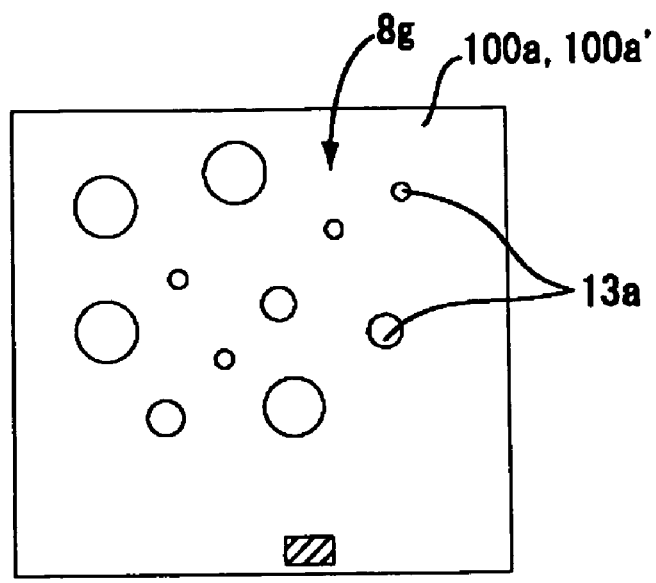
Fig. 11B
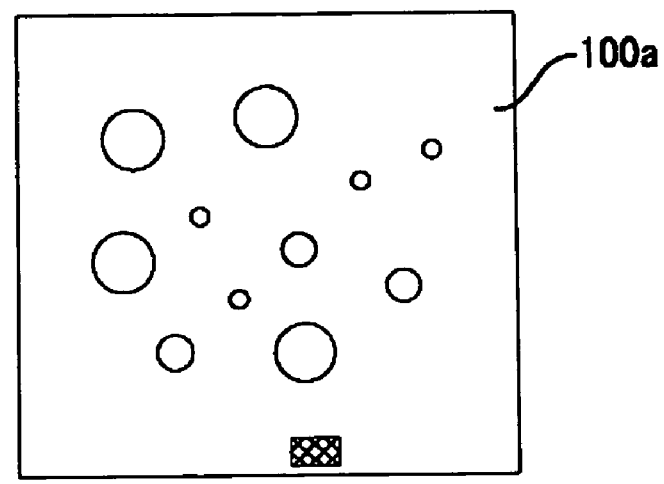
Fig. 11C
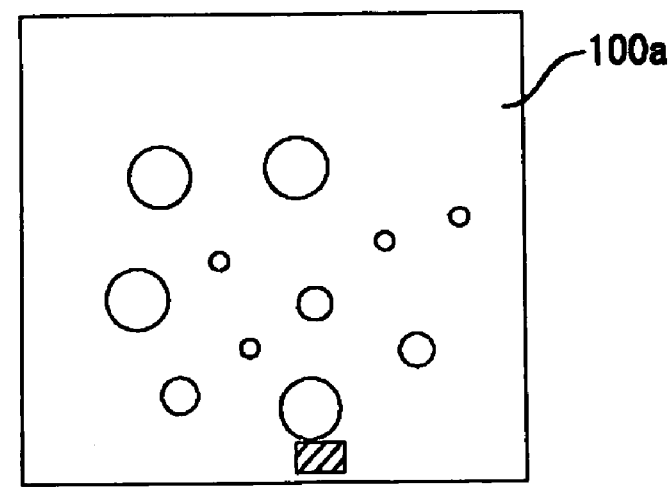

ELECTRO-OPTIC DEVICE COMPRISING A RECESS/PROJECTION PATTERN OBTAINED BY ROTATING A REFERENCE PATTERN ABOUT A PREDETERMINED POSITION

BACKGROUND OF THE INVENTION

1. Field of Invention

The present invention relates to an electro-optic device in which an electro-optic material is held on a substrate, and an electronic apparatus using the electro-optic device. More particularly, the present invention relates to a recess/projection forming technique to form a light-scattering reflecting surface on the substrate used in an electro-optic device.

2. Description of Related Art

Electro-optic devices, such as liquid crystal devices, are employed as direct-view-type displays in various types of equipment. Of those electro-optic devices, a reflective or transflective liquid crystal device employing a TFT active matrix is constructed as shown in FIGS. 20 and 21. In each of multiplicity of pixels 100a arranged in a matrix pattern on the surface of a TFT array substrate 10, a light reflecting film 8a to reflect an extraneous light, which has entered from the opposed substrate side, in a direction toward an opposed substrate 20 is formed below a transparent pixel electrode 9a, so that the light having entered from the side of the opposed substrate 10 is reflected from the side of the TFT array substrate 10. An image is displayed with the light emerging from the opposed substrate side.

In such a liquid crystal display device to display an image in the reflection mode, if the light reflected by the light reflecting film 8a has strong directivity, there occurs noticeable dependency on the viewing angle in such a point that image brightness varies depending on the angle of viewing the image. To avoid that drawback, a related art liquid crystal display device is constructed as follows. After coating a photosensitive resin made of an organic resin, e.g., an acrylic resin, at a relatively large thickness on the surface of a second interlayer insulating film 5, the photosensitive resin is patterned by the photolithography technique. A lower-side recess/projection forming film 13a, having a plurality of recesses and projections, is thereby formed below the light reflecting film 8a. Then, an upper-side recess/projection forming film 7a is formed on the surface of the lower-side recess/projection forming film 13a so that the recesses and the projections have relatively gentle slopes. As a result, a light-scattering recess/projection pattern 8g having a gently sloped shape is formed on the surface of the light reflecting film 8a that is formed above the upper-side recess/projection forming film 7a.

However, if the recess/projection pattern 8g on the surface of the light reflecting film 8a has the same sloped shape for each pixel 100a, a problem occurs in that reflected lights from the light reflecting film 8a interfere with each other and display quality is noticeably reduced.

It is therefore proposed to form the recess/projection pattern 8g so as to have shapes different from each other for each pixel 100a.

However, if the recess/projection pattern 8g is formed so as to just have shapes different from each other for each pixel 100a, another problem occurs in that chrominance non-uniformity and glare are caused by variations of scattering reflection characteristics in the respective pixels 100a.

SUMMARY OF THE INVENTION

In view of the problems mentioned above, an object of the present invention is to provide an electro-optic device capable of reducing or preventing an interference of reflected lights from a light reflecting film and reducing or avoiding the occurrence of glare and chrominance non-uniformity among pixels, and an electronic apparatus using the electro-optic device.

To address the above object, the present invention provides an electro-optic device in which a recess/projection forming layer having asperities formed in a dispersed condition and a light reflecting film formed above the recess/projection forming layer are disposed in each of a multiplicity of pixels formed in a matrix pattern on a substrate for holding an electro-optic material. The recess/projection forming layer forms a recess/projection pattern to scatter light on a surface of the light reflecting film, the multiplicity of pixels being grouped into plural units each including a plurality of pixels. The recess/projection pattern is formed to provide a different pattern for each pixel, at least in each of the units and the recess/projection pattern for the pixel at the same position in each unit differs among the units, and variations in planar shapes, planar sizes, or planar position distribution of projections or recesses constituting the asperities are controlled among the pixels.

Stated another way, when forming the recess/projection pattern with the photolithography technique, in a process of manufacturing an electro-optic device, an exposure mask having light passing portions or light shielding portions to form the projections or the recesses constituting the asperities is employed in which variations in planar shapes, planar sizes, or planar position distribution of the projections or the recesses are controlled among the pixels and hence those variations are suppressed. By employing such an exposure mask, when the multiplicity of pixels are grouped into plural units, each including a plurality of pixels, the recess/projection pattern is formed to provide a different pattern for each pixel, at least in each of the units and the recess/projection pattern for the pixel at the same position in each unit, differs among the units.

With the present invention, since the recess/projection pattern is formed to provide a different pattern for each pixel in each of the units and the position of the same recess/projection pattern in each unit differs among the units, the same recess/projection pattern is avoided from appearing repetitively in each unit and among units. Therefore, reflected lights from the light reflecting film are harder to interfere with each other. Further, since variations in planar shapes, planar sizes, or planar position distribution of the asperities are controlled in the recess/projection pattern, it is possible to avoid the occurrence of glare and chrominance non-uniformity among the pixels.

Also, the present invention provides an electro-optic device in which a recess/projection forming layer having a plurality of asperities formed in a dispersed condition and a light reflecting film formed above the recess/projection forming layer, are disposed in each of a multiplicity of pixels formed in a matrix pattern on a substrate for holding an electro-optic material. The recess/projection forming layer forms a recess/projection pattern to scatter light on a surface of the light reflecting film, the recess/projection pattern being formed to provide a different pattern for each pixel, and variations in planar shapes, planar sizes, or planar position distribution of projections or recesses constituting the asperities are controlled among the pixels. Stated another way, when forming the recess/projection pattern with the photolithography technique, in a process of manufacturing an electro-optic device, an exposure mask, having light passing portions or light shielding portions to form the projections or the recesses constituting the asperities, is employed, in which variations in planar shapes, planar sizes, or planar position distribution of the projections or the recesses are controlled among the pixels and hence those variations are suppressed. By employing such an exposure mask, the recess/projection pattern is formed to provide a different pattern for each of the multiplicity of pixels.

With the present invention, since the recess/projection pattern is formed to provide a different pattern for each of the multiplicity of pixels, the same recess/projection pattern is avoided from appearing repetitively. Therefore, reflected lights from the light reflecting film are harder to interfere with each other. Further, since variations in planar shapes, planar sizes, or planar position distribution of the asperities are controlled in the recess/projection pattern, it is possible to avoid the occurrence of glare and chrominance non-uniformity among the pixels.

In the present invention, the projections or the recesses constituting the asperities have, for example, a circular or polygonal plan shape. Stated another way, the light passing portions or the light shielding portions of the exposure mask to form the projections or the recesses constituting the asperities have, for example, a circular or polygonal shape.

In the present invention, when viewing the electro-optic device in a direction inclined 10 degrees to 30 degrees from the direction vertical to the substrate, a ratio of standard deviation/average value of reflection luminance is preferably within 10% among the pixels.

In the present invention, according to one exemplary embodiment, the projections or the recesses constituting the asperities are formed in plural kinds having different planar sizes in one pixel. Stated another way, the light passing portions or the light shielding portions of the exposure mask, to form the projections or the recesses constituting the asperities, are preferably formed in plural kinds having different planar sizes in an area corresponding to one pixel.

In the present invention, according to one exemplary embodiment the projections or the recesses constituting the asperities are formed such that the number of the projections or the recesses having the same planar size in one pixel is equal among the pixels. Stated another way, the number of those of the light passing portions or the light shielding portions of the exposure mask in a region corresponding to one pixel, to form the projections or the recesses constituting the asperities, which have the same planar size, is preferably equal among the pixels.

In the present invention, when an area in which the recess/projection pattern is formed is divided into small planes and an existence rate of small planes having respective angles, which are formed by the small planes relative to the substrate plane, in one pixel is represented in the form of a histogram, a ratio of standard deviation/average value for a total of the existence rates of the small planes, in each of which the angle is in the range of 3° to 10°, is preferably within 10% among the pixels.

In the present invention, according to one exemplary embodiment, a ratio of standard deviation/average value for a total area of the projections or the recesses constituting the asperities is within 5% among the pixels. Stated another way, a ratio of standard deviation/average value for a total area of the light passing portions or the light shielding portions of the exposure mask, to form the projections or the recesses constituting the asperities, is preferably within 5% among the pixels.

In the present invention, according to one exemplary embodiment, a ratio of standard deviation/average value for a total area of those of the projections or the recesses constituting the asperities, which are present in a pixel area, excepting an area where a black matrix is formed, is within 5% among the pixels. Stated another way, a ratio of standard deviation/average value for a total area of those of the light passing portions or the light shielding portions of the exposure mask, to form the projections or the recesses constituting the asperities, which are present in a pixel area excepting an area where a black matrix is formed, is preferably within 5% among the pixels.

In the present invention, when Delaunay triangles are drawn based on respective center position coordinates of the projections or the recesses constituting the asperities, a ratio of standard deviation/average value of lengths of Delaunay lines is preferably not larger than 35%. Stated another way, when Delaunay triangles are drawn based on respective center position coordinates of the light passing portions or the light shielding portions of the exposure mask to form the projections or the recesses constituting the asperities, a ratio of standard deviation/average value of lengths of Delaunay lines is preferably not larger than 35%.

In the present invention, preferably, a total area of those of the projections or the recesses constituting the asperities, which are cut halfway at ends of each pixel, is equal to an integer times normal areas of those recesses or projections. Stated another way, a total area of those of the light passing portions or the light shielding portions of the exposure mask, to form the projections or the recesses constituting the asperities, which are cut halfway at ends of each pixel, is preferably equal to an integer times normal areas of those recesses or projections. With such an arrangement, even when the projections or the recesses are cut halfway at the ends of the pixel, the number and area of the projections or the recesses formed in each pixel can be held substantially the same.

In the present invention, according to one exemplary embodiment, an overlap rate of the projections or the recesses, constituting the asperities among the pixels, is not smaller than 50%. Stated another way, an overlap rate, among the pixels, of the light passing portions or the light shielding portions of the exposure mask, to form the projections or the recesses constituting the asperities, is preferably not smaller than 50%.

In the present invention, for example, an asperity forming pattern larger than one pixel is set as a reference pattern, and positions of the projections and the recesses, constituting the asperities for each of the pixels, are decided using a recess/projection pattern which is obtained by rotating the reference pattern about a predetermined position. Stated another way, the projections or the recesses, constituting the asperities, are formed using an exposure mask in which positions of the light passing portions or the light shielding portions thereof are decided through setting, as a reference pattern, an asperity forming pattern larger than one pixel, and employing a recess/projection pattern which is obtained by rotating the reference pattern about a predetermined position.

In the present invention, for example, an asperity forming pattern larger than a total area of the m×n number of pixels is set as a reference pattern, and positions of the projections and recesses constituting the asperities for each of the pixels are decided using a recess/projection pattern for the m×n number of pixels, which is obtained by rotating the reference pattern about a predetermined position. Stated another way, the projections or the recesses constituting the asperities are formed using an exposure mask in which positions of the light passing portions or the light shielding portions thereof are decided through setting, as a reference pattern, an asperity forming pattern larger than a total area of the m×n number of pixels, and employing a recess/projection pattern for the m×n number of pixels, which is obtained by rotating the reference pattern about a predetermined position.

In the present invention, according to one exemplary embodiment, different recess/projection patterns are formed in the respective pixels by moving the center of rotation of the reference pattern while the reference pattern is rotated. In this case, the center of rotation of the reference pattern is preferably set to a position deviated from the projections or the recesses constituting the asperities. Stated another way, the projections or the recesses constituting the asperities are preferably formed using an exposure mask, in which positions of the light passing portions or the light shielding portions thereof, are decided while the center of rotation of the reference pattern is set to a position deviated from the light passing portions or the light shielding portions of the exposure mask, to form the projections or the recesses constituting the asperities.

In the present invention, when the light reflecting film is electrically connected to a lower or upper conductive layer through a contact hole and is formed except for the contact hole, in one exemplary embodiment the center of rotation of the reference pattern is set to a position overlapping with the contact hole. Stated another way, when the light reflecting film is electrically connected to a lower or upper conductive layer through a contact hole and is formed except for the contact hole, the projections or the recesses constituting the asperities, are formed using an exposure mask in which positions of the light passing portions or the light shielding portions thereof are decided by setting the center of rotation of the reference pattern to a position overlapping with the contact hole.

In the present invention, when the light reflecting film has a light passing window formed therein to display an image in a transmission mode, it is preferable that the center of rotation of the reference pattern be set in the light passing window. Stated another way, when the light reflecting film has a light passing window formed therein to display an image in a transmission mode, the projections or the recesses constituting the asperities are formed using an exposure mask in which positions of the light passing portions or the light shielding portions thereof are decided by setting the center of rotation of the reference pattern in the light passing window.

In the present invention, for example, a rectangular area, made up of recess/projection patterns having continuity in patterns at respective left and right ends and continuity in patterns at respective upper and lower ends, is set as a basic pattern. Positions of the projections and the recesses, constituting the asperities for the respective pixels, are decided using a plurality of recess/projection patterns which are obtained by translating a region to cut out each of the recess/projection patterns from the basic pattern up, down, rightward or leftward, while maintaining continuity in patterns at ends of the cutting-out region.

In that case, preferably, the cutting-out region covers several pixels.

In the present invention, when the cutting-out region covers one pixel, a size of the cutting-out region corresponds to an aperture area of the pixel, excepting an area in which a light shield film is formed.

In the present invention, a liquid crystal device can be constructed, for example, as the electro-optic device by preparing the substrate as a first substrate, arranging a second substrate in an opposed relation to the first substrate, and holding a liquid crystal as the electro-optic material between both the substrates.

The electro-optic device, according to the present invention, is employed as a display of an electronic apparatus, such as a cellular phone or a mobile computer.

BRIEF DESCRIPTION OF THE DRAWINGS

FIGS. 11(A) to 11(C) are schematics showing a difference of the recess/projection pattern formed in the pixels in the electro-optic device to which the present invention is applied.

DETAILED DESCRIPTION OF PREFERRED EMBODIMENTS

An exemplary embodiment of the present invention will be described below with reference to the drawings.

Basic Construction of Electro-Optic Device

Figure 1:
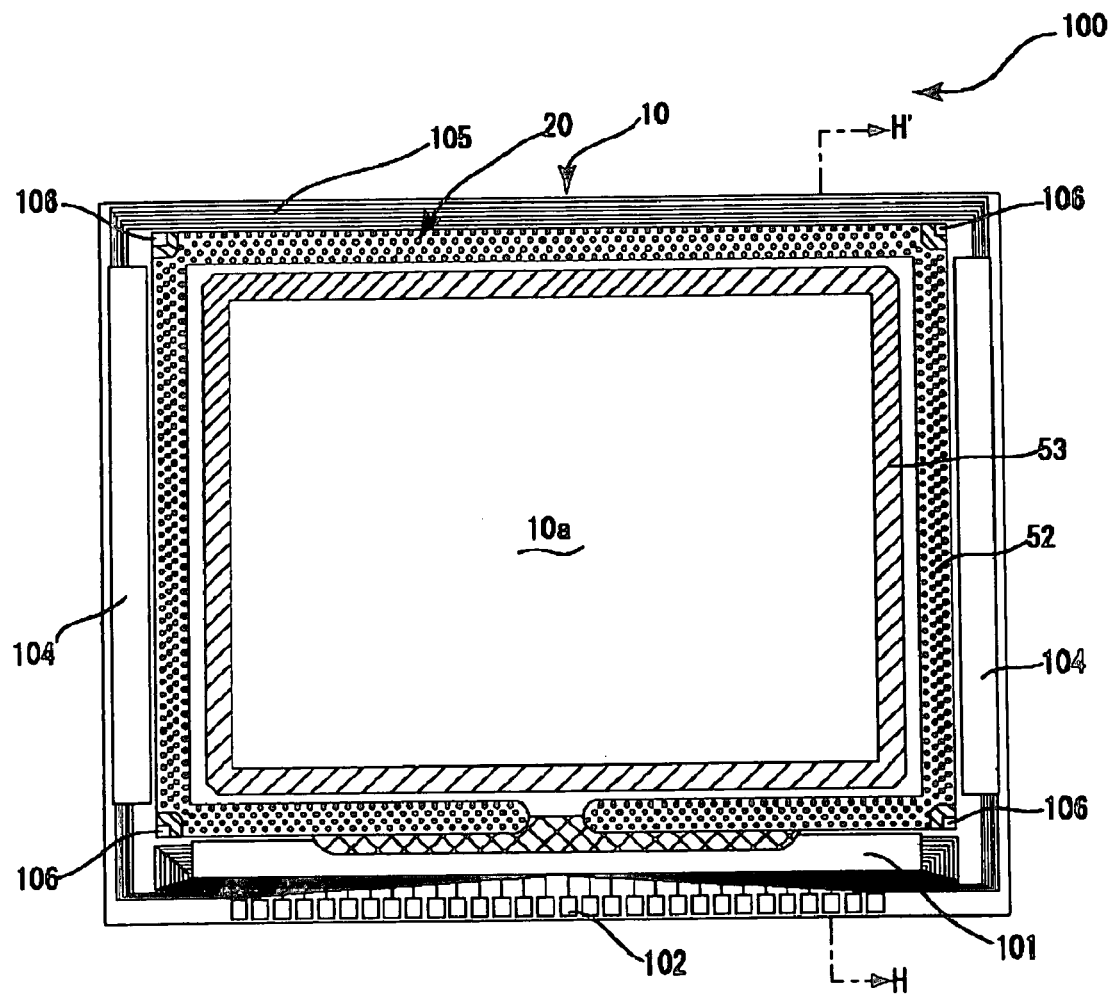
FIG. 1 is a plan view of an electro-optic device, looking from the opposed substrate side.
Figure 2:
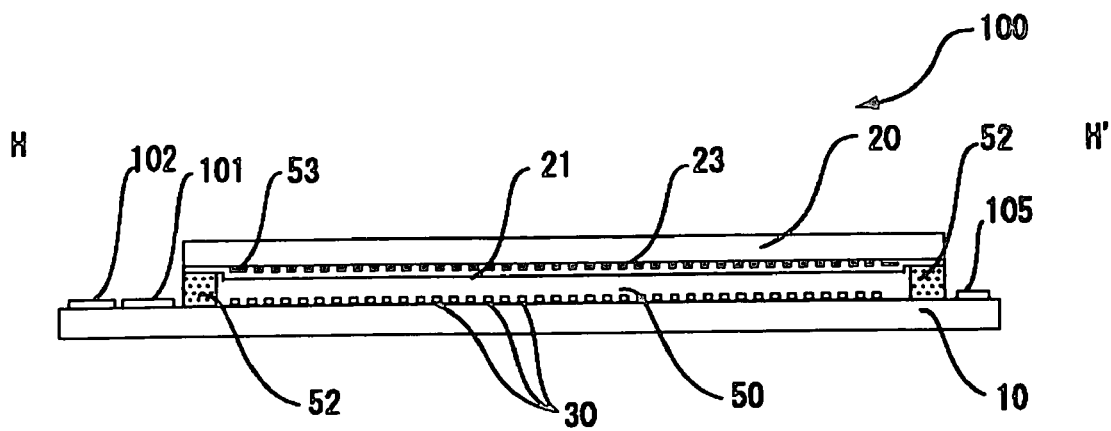
FIG. 2 is a sectional view taken along the plane H–H' in FIG. 1.
Figure 3:
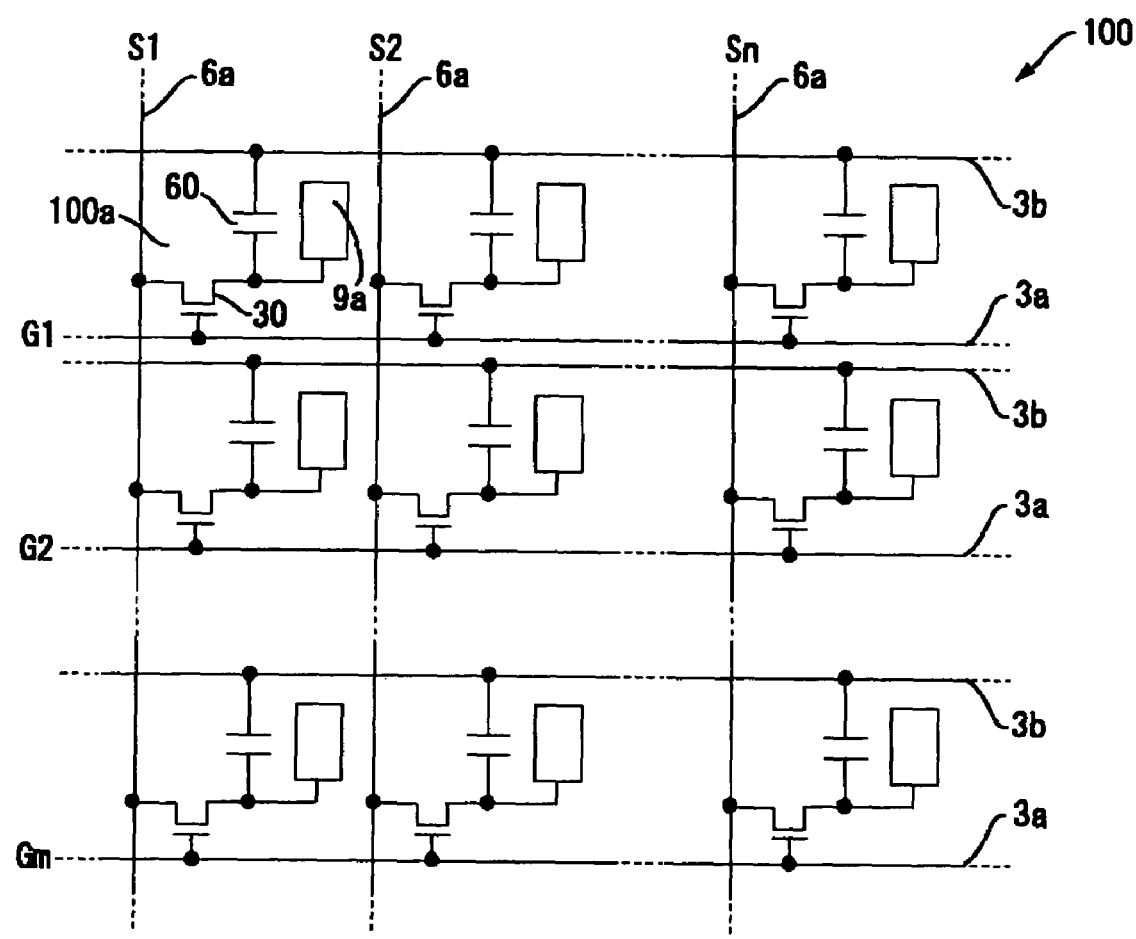
FIG. 3 is an equivalent circuit schematic of various elements, wiring, etc., which are formed in a plurality of pixels arranged in a matrix pattern in the electro-optic device.

FIG. 1 is a plan view of an electro-optic device including various components, to which the present invention is applied, looking from the opposed substrate side. FIG. 2 is a sectional view taken along the plane H-H' in FIG. 1. FIG. 3 is an equivalent circuit schematic of various elements, wiring, etc., which constitute a plurality of pixels formed in a matrix pattern in an image display area of the electro-optic device. In each of the drawings attached for explaining the exemplary embodiment, various layers and various members are shown at different scales so that the various layers and the various members appearing in the drawings large are recognizable.

Referring to FIGS. 1 and 2, an electro-optic device 100 (liquid crystal device) of this exemplary embodiment includes a TFT array substrate 10 (first substrate) and an opposed substrate 20 (second substrate), both the substrates being bonded to each other with a sealing member 52 interposed therebetween. A liquid crystal 50, serving as an electro-optic material, is held in an area (liquid crystal sealed-in area) defined by the sealing member 52. A peripheral boundary line 53, made of a light shield material, is formed inward of a region in which the sealing member 52 is formed. In a region outside the sealing members 52, a data line driving circuit 101 and mount terminals 102 are formed along one side of the TFT array substrate 10. Scan line driving circuits 104 are formed along two sides of the TFT array substrate 10, which are adjacent to the aforesaid one side. Along the remaining one side of the TFT array substrate 10, a plurality of wires 105 are arranged to connect the scan line driving circuits 104 disposed on both sides of the image display area. Further, in some cases, a precharge circuit and a check circuit may be disposed, for example, in a space below the boundary line 53. Additionally, in at least one of corners of the opposed substrate 20, an inter-substrate conducting member 106 is formed to electrically conduct between the TFT array substrate 10 and the opposed substrate 20.

Instead of forming the data line driving circuit 101 and the scan line driving circuits 104 on the TFT array substrate 10, a TAB (Tape Automated Bonding) substrate including a built-in driving LSI, for example, may be electrically and mechanically connected to a group of terminals in a peripheral portion of the TFT array substrate 10 through an anisotropic conductive film. In the electro-optic device 100, while a polarizing film, a phase difference film, a polarizing plate, etc. are selectively disposed in predetermined directions depending on the type of the liquid crystal 50 used, i.e., depending on the operation mode, such as the TN (Twisted Nematic) or STN (Super-TN) mode and the normally white or normally black mode, those components are not shown here.

When the electro-optic device 100 is constructed to be adapted for color display, an RGB color filter is formed along with a protective film for the same in an area of the opposed substrate 20, which is located to face pixel electrodes (described later) on the TFT array substrate 10.

In the image display area of the electro-optic device 100 having the above-described structure, as shown in FIG. 3, a plurality of pixels 100a are constituted in a matrix pattern. A pixel electrode 9a and a pixel switching TFT 30 to drive the pixel electrode 9a, are formed in each of the pixels 100a. Data lines 6a to supply pixel signals S1, S2 . . . Sn are electrically connected to respective sources of the TFTs 30. The pixel signals S1, S2 . . . Sn, written to the data lines 6a, may be supplied in the order named in a linear sequence, or may be supplied to plural adjacent data lines 6a at a time for each of data line groups. Further, scan lines 3a are electrically connected to respective gates of the TFTs 30 so that pulsed scan signals G1, G2 . . . Gm are applied to the scan lines 3a in the order named in a linear sequence at respective predetermined timings. The pixel electrodes 9a are electrically connected to respective drains of the TFTs 30. By bringing the TFTs 30 as switching devices into the on-state for only a certain period, the pixel signals S1, S2 . . . S2 . . . Sn, supplied from the data lines 6a, are written into the respective pixels at predetermined timings. The pixel signals S1, S2 . . . Sn at predetermined levels, which have been written into the liquid crystal through the pixel electrodes 9a as described above, are held for a certain period between the pixel electrodes 9a and a counter electrode 21 provided on the opposed substrate 20 shown in FIG. 2.

The liquid crystal 50 is able to modulate light and realize gray scale display by changing the orientation or the order of a set of its molecules in accordance with a level of an applied voltage. In the normally white mode, the amount of a part of incident light, which passes through a corresponding portion of the liquid crystal 50, is reduced in accordance with the applied voltage. In the normally black mode, the amount of a part of incident light, which passes through a corresponding portion of the liquid crystal 50, is increased in accordance with the applied voltage. Consequently, as a whole, lights having respective contrasts depending on the pixel signals S1, S2 . . . Sn are emitted from the electro-optic device 100.

To reduce or prevent leakage of the pixel signals S1, S2 . . . Sn held in place, an accumulative capacitance 60 may be additionally disposed in parallel to a liquid crystal capacitance formed between the pixel electrode 9a and the counter electrode 21. For example, the voltage of the pixel electrode 9a can be held by the accumulative capacitance 60 for a time triple digits longer than the time during which the source voltage is applied. As a result, the electro-optic device 100, having enhanced characteristics in retention of electric charges and having a higher contrast ratio, can be realized. The accumulative capacitance 60 may be formed between the TFT drain and a capacitance line 3b serving as a wire dedicated to form the accumulative capacitance 60 as shown in FIG. 3, or it may be formed between the TFT drain and the scan line 3a belonging to the preceding stage.

Construction of TFT Array Substrate

Figure 4:
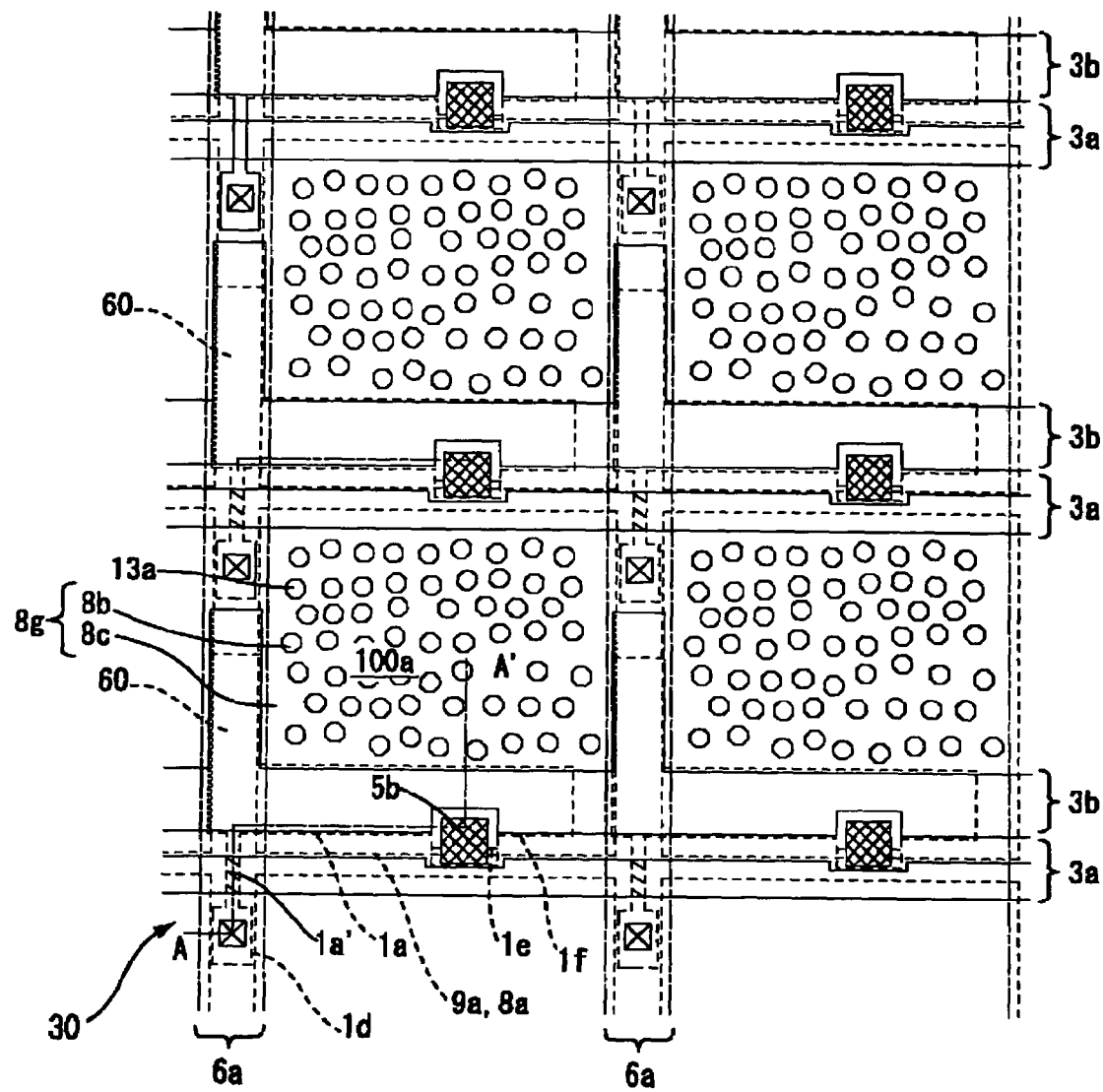
FIG. 4 is a plan view showing a construction of each of pixels formed on a TFT array substrate of the electro-optic device to which the present invention is applied.
Figure 5:
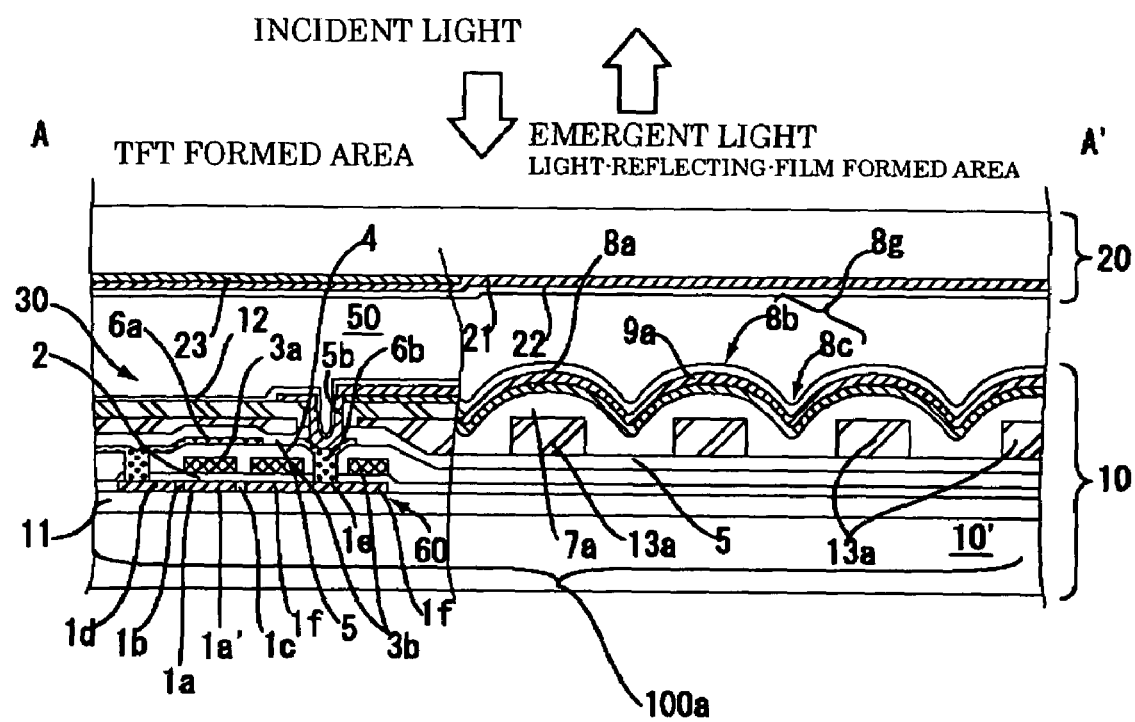
FIG. 5 is a sectional view of the pixel sectioned in positions denoted by the plane A–A' in FIG. 4.

FIG. 4 is a plan view of a group of plural adjacent pixels on the TFT array substrate used in the electro-optic device of this exemplary embodiment. FIG. 5 is a sectional view of a part of a pixel in the electro-optic device, sectioned in positions denoted by the plane A—A' in FIG. 4.

Referring to FIG. 4, the plurality of pixel electrodes 9a, each formed of a transparent ITO (Indium Tin Oxide) film, are formed in a matrix pattern on the TFT array substrate 10, and the pixel switching TFTs 30 are connected to the pixel electrodes 9a in a one-to-one relation. Also, the data line 6a, the scan line 3a and the capacitance line 3b are formed along length and width boundaries of each of the pixel electrodes 9a, and the TFT 30 is connected to the data line 6a and the scan line 3a. More specifically, the data line 6a is electrically connected to a high-density source region 1d of the TFT 30 through a contact hole. The pixel electrode 9a is electrically connected to a high-density drain region 1e of the TFT 30 through a contact hole. Further, the scan line 3a is extended in an opposed relation to a channel region 1a' of the TFT 30. The accumulative capacitance 60 (accumulative capacitance element) is of an overlapped structure including a lower electrode formed by making conductive an extended portion 1f of a semiconductor film 1 to form the pixel switching TFT 30, and an upper electrode formed by the capacitance line 3b in the same layer as the scan line 3a in an overlapped relation to the lower electrode 41.

In each pixel 100a thus constructed, below the pixel electrode 9a, a light reflecting film 8a is formed in an area substantially overlapping with the pixel electrode 9a as described later.

In the section of the thus-constructed pixel 100a taken along the plane A–A', as shown in FIG. 5, an underlying protective layer 11, formed of a silicon oxide film (insulating film) with a thickness of 300 nm to 500 nm, is formed on the surface of a transparent base plate 10' serving as a base of the TFT array substrate 10, and an island-shaped semiconductor film 1a with a thickness of 50 nm to 100 nm is formed on the surface of the underlying protective layer 11. A gate insulating film 2a, formed of a silicon oxide film with a thickness of about 50 nm to 150 nm, is formed on the surface of the semiconductor film 1a, and the scan line 3a with a thickness of 300 nm to 800 nm is extended as a gate electrode on the surface of the gate insulating film 2a. A region of the semiconductor film 1a, which is opposed to the scan line 3a with the gate insulating film 2a interposed therebetween, serves as the channel region 1a'. A source region, including a low-density source region 1b and the high-density source region 1d, is formed on one side of the channel region 1a'. A drain region, including a low-density drain region 1c and the high-density drain region 1e, is formed on the other side of the channel region 1a'.

A first interlayer insulating film 4, formed of a silicon oxide film with a thickness of 300 nm to 800 nm and a second interlayer insulating film 5, (surface protective film) formed of a silicon nitride film with a thickness of 100 nm to 300 nm, are formed on the surface side of the pixel switching TFT 30. The data line 6a, with a thickness of 300 nm to 800 nm, is formed on the surface of the first interlayer insulating film 4 and is electrically connected to the high-density source region 1d through a contact hole formed in the first interlayer insulating film 4. A drain electrode 6b, which is formed at the same time as the data line 6a, is formed on the surface of the first interlayer insulating film 4, and the drain electrode 6b is electrically connected to the high-density drain region 1e through a contact hole formed in the first interlayer insulating film 4.

On the second interlayer insulating film 5, a lower-side recess/projection forming film 13a, made of a photosensitive resin, such as an organic resin, and an upper-side recess/projection forming film 7a, made of polysilazane or an organic resin, are formed in the order named. The light reflecting film 8a, formed of, e.g., an aluminum film, is formed on the surface of the upper-side recess/projection forming film 7a.

The transparent pixel electrode 9a, formed of an ITO film, is formed on the light reflecting film 8a. The pixel electrode 9a is directly laid on the surface of the light reflecting film 8a for electrical connection between the pixel electrode 9a and the light reflecting film 8a. Also, the pixel electrode 9a is electrically connected to the drain electrode 6b through a contact hole 5b formed in both the upper-side recess/projection forming film 7a and the second interlayer insulating film 5. The light reflecting film 8a is not formed in the contact hole 5b, but it is positioned in contact with the pixel electrode 9a. Thus, the light reflecting film 8a is essentially electrically connected to the drain electrode 6b through the pixel electrode 9a and the contact hole 5b.

An alignment film 12, formed of a polyimide film, is formed on the surface side of the pixel electrode 9a. The alignment film 12 is a film obtained by rubbing a polyimide film.

Also, the capacitance line 3b, in the same layer as the scan line 3a is positioned as the upper electrode in an opposed relation to the extended portion 1f (lower electrode), extending from the high-density drain region 1e, through an insulating film (dielectric film) formed at the same time as the gate insulating film 2a, whereby the accumulative capacitance 60 is constituted.

While the TFT 30 preferably has the LDD structure as described above, it may have an offset structure in which impurity ions are not implanted in areas corresponding to the low-density source region 1b and the low-density drain region 1c. Further, the TFT 30 may be a self-aligned TFT in which high-density source and drain regions are formed in a self-aligned manner by implanting impurity ions at a high density with the gate electrode (part of the scan line 3a) employed as a mask.

While this exemplary embodiment is of the single gate structure having only one gate electrode (scan line 3a) of the TFT 30 between the source and drain regions, two or more gate electrodes may be disposed between those regions. In such a case, the same signal is applied to each of the gate electrodes. By constructing the TFT 30 so as to have a dual gate (double gate) or a triple or more gate, it is possible to prevent leak currents through joints of the channel with the source and drain regions, and hence to reduce the current in the off-state. By constructing at least one of those gate electrodes, so as to have the LDD structure or the offset structure, the current in the off-state can be further reduced and a stable switching device can be obtained.

Construction of Recess/Projection Pattern

Referring to FIGS. 4 and 5, in the TFT array substrate 10, a recess/projection pattern 8g including projections 8b and recesses 8c, is formed in a reflecting area of each pixel 100a, in a part of the surface of the light reflecting film 8a (light-reflecting-film formed area) located away from the area in which the TFT 30 is formed.

For constituting the recess/projection pattern 8g, in the TFT array substrate 10 of this exemplary embodiment, the lower-side recess/projection forming film 13a made of an organic photosensitive resin is formed in the form of plural pillar projections (asperities) at a predetermined distribution on the surface of the second interlayer insulating film 5 in an area under the light reflecting film 8a, in which the film 13a overlaps with the light reflecting film 8a, when viewed from above. The upper-side recess/projection forming film 7a formed of an insulating film, which is made of a fluid material, such as polysilazane or an organic resin, is laid over the lower-side recess/projection forming film 13a. As a result, the recess/projection pattern 8g, corresponding to the recesses and the projections of the lower-side recess/projection forming film 13a, is formed on the surface of the light reflecting film 8a. In the recess/projection pattern 8g, the upper-side recess/projection forming film 7a serves to smoothen edges of the lower-side recess/projection forming film 13a so that no sharp edges appear.

As an alternative, edges of the asperities (recesses 13b) of the lower-side recess/projection forming film 13a may be smoothened by carrying out a baking step, after the formation of the lower-side recess/projection forming film 13a, without forming the upper-side recess/projection forming film 7a.

The pillar projections constituting the asperities formed by the lower-side recess/projection forming film 13a have a circular or substantially polygonal shape in a plan view.

Construction of Opposed Substrate

Referring to FIG. 5, in the opposed substrate 20, a light shield film 23 called a black matrix or a black stripe is formed in areas opposed to the length and width boundary areas of the pixel electrode 9a formed in the TFT array substrate 10. A counter electrode 21, formed of an ITO film, is formed on the light shield film 23. An alignment film 22, formed of a polyimide film, is formed on the counter electrode 21. The alignment film 22 is a film obtained by rubbing a polyimide film.

Method of Manufacturing TFT

A method of manufacturing the TFT array substrate 10 of this exemplary embodiment will be described below with reference to FIGS. 6 and 7.

Figure 6:
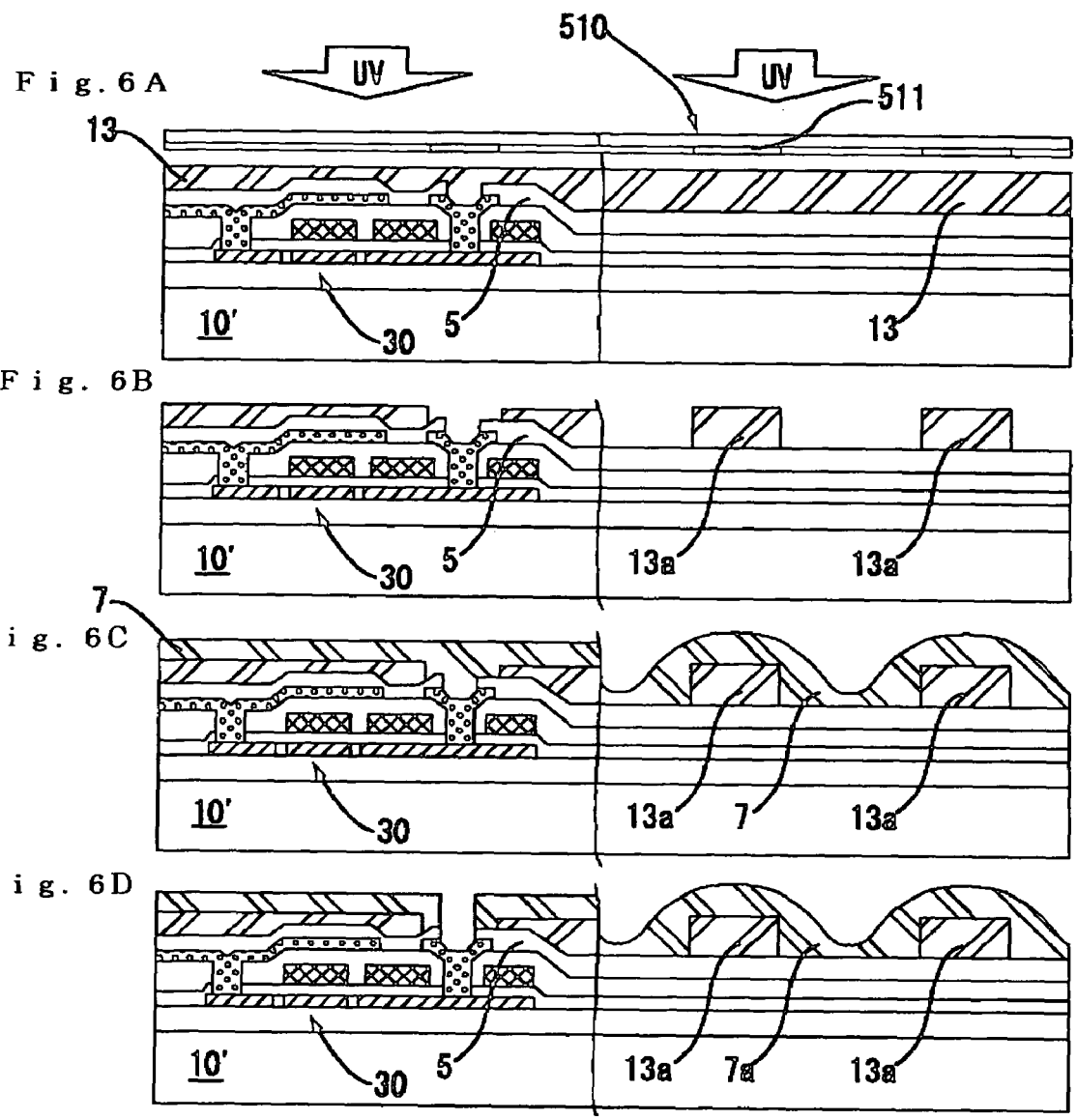
FIGS. 6(A) to 6(D) are sectional views showing successive steps of a method of manufacturing the TFT array substrate of the electro-optic device to which the present invention is applied.
Figure 7:
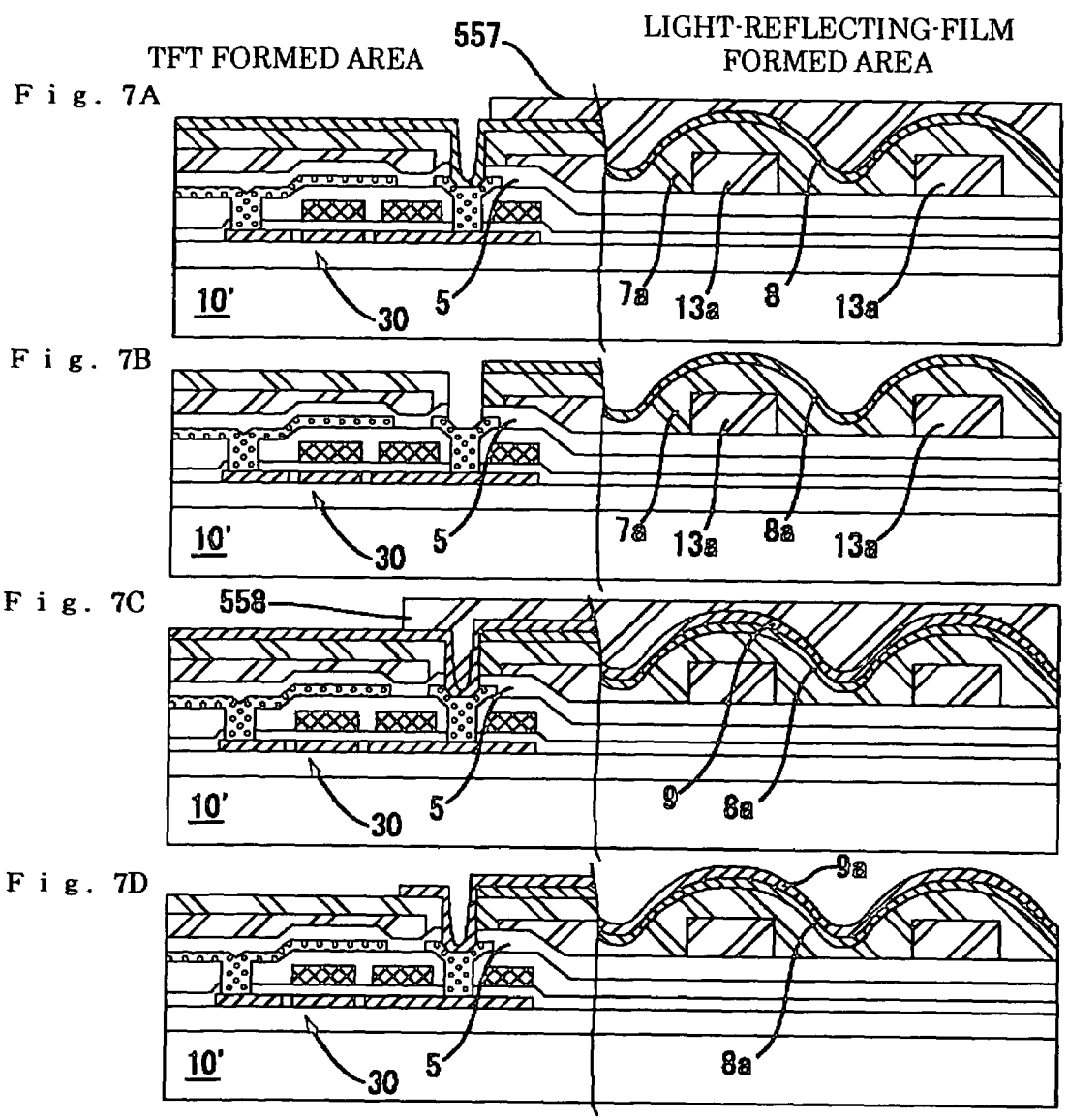
FIGS. 7(A) to 7(D) are sectional views showing successive steps, subsequent to the steps shown in FIG. 6, of the method of manufacturing the TFT array substrate of the electro-optic device to which the present invention is applied.

FIGS. 6 and 7 are sectional views showing successive steps of the method of manufacturing the TFT array substrate 10 of this exemplary embodiment. Each of FIGS. 6 and 7 shows sections of the TFT formed area and the light-reflecting-film formed area.

When manufacturing the TFT array substrate 10 of this exemplary embodiment, the steps of manufacturing the TFT 30, etc. are carried out by using the so-called low temperature process. Because such a method is already known, the following description is made of only the steps related to the features of the TFT array substrate 10 of this exemplary embodiment.

In the manufacturing of the TFT array substrate 10 of this exemplary embodiment, as shown in FIG. 6(A), the TFT 30 is formed on the surface of the base plate 10' made of glass, for example, and thereafter the contact hole 5b is formed in the second interlayer insulating film 5.

After coating an organic photosensitive resin 13 at a relatively large thickness on the surface of the second interlayer insulating film 5, the photosensitive resin 13 is exposed through an exposure mask 510. Although the photosensitive resin 13 used here may be of the negative type or the positive type, the photosensitive resin 13 is shown as being, by way of example, of the positive type in FIG. 6(A). An ultraviolet ray is illuminated to areas of the photosensitive resin 13, in which the resin 13 is to be removed, through light transmitted portions 511 of the exposure mask 510.

Then, the exposed photosensitive resin 13 is developed to form, as shown in FIG. 6(B), the lower-side recess/projection forming film 13a, including the pillar projections and the contact hole 5b, described above with reference to FIG. 5, in the area under the light reflecting film 8a, in which the film 13a overlaps with the light reflecting film 8a when viewed from above.

Then, the upper-side recess/projection forming film 7a, including the contact hole 5b, is formed through steps of coating a perhydropolysilazane or a composition containing it, on the surface side of both the second interlayer insulating film 5 and the lower-side recess/projection forming film 13a, and then baking the coating, as shown in FIG. 6(C), or through coating a fluid material 7, made of an organic resin, on that surface side, exposing and developing the coating, i.e., and patterning the coating with the photolithography technique, as shown in FIG. 6(D).

The term "perhydropolysilazane" means one kind of inorganic polysilazane and is a coating material which can be applied in place and converted into a silicon oxide film with baking in the atmosphere. Polysilazane, made by Tonen, K. K., for example, is an inorganic polymer in units of — (SiH$_2$NH)— and is soluble to an organic solvent such as xylene. Accordingly, by preparing a coating liquid as an organic solvent solution (e.g., 20% xylene solution) of the inorganic polymer, coating the prepared liquid with the spin coating process (e.g., at 2000 rpm for 20 sec), and baking the coating in the atmosphere at a temperature of 450° C., the polysilazane reacts with moisture and oxygen, whereupon an amorphous silicon oxide film can be obtained which is at a highly dense level comparable to or better than, a silicon oxide film formed with the CVD process.

Because the upper-side recess/projection forming film 7a is formed by coating the fluid material, the recesses and the projections of the lower-side recess/projection forming film 13a are appropriately smoothened, and the recess/projection pattern 8g having a smooth shape free from edges, is formed on the surface of the upper-side recess/projection forming film 7a.

In the case of forming the recess/projection pattern 8g having a moderate shape without forming the upper-side recess/projection forming film 7a, the edges of the lower-side recess/projection forming film 13a may be smoothened by performing the baking step in the condition shown in FIG. 6(B).

Then, as shown in FIG. 7(A), a metal film 8 having reflectivity, e.g., an aluminum film, is formed on the surface of the upper-side recess/projection forming film 7a by sputtering, for example, and thereafter a resist mask 557 is formed by using the photolithography technique.

Then, the metal film 8 is etched through the resist mask 557 to leave the light reflecting film 8a in a predetermined area as shown in FIG. 7(B). On the surface of the light reflecting film 8a thus formed, the recess/projection pattern 8g, with a recess size of not smaller than 500 nm or preferably not smaller than 800 nm, is formed depending on the asperities constituted by the recesses 13b of the lower-side recess/projection forming film 13a. In addition, the recess/projection pattern 8g has a smooth shape free from edges with the presence of the upper-side recess/projection forming film 7a.

Then, as shown in FIG. 7(C), an ITO film 9 with a thickness of 40 nm to 200 nm is formed on the surface of the light reflecting film 8a by sputtering, for example, and thereafter a resist mask 558 is formed by using the photolithography technique.

Then, the ITO film 9 is etched through the resist mask 558 to form the pixel electrode 9a, as shown in FIG. 7(D), which is electrically connected to the drain electrode 6b.

Subsequently, as shown in FIG. 5, a polyimide film (alignment film 12) is formed on the front side of the pixel electrode 9a. To that end, after printing a polyimide varnish with the flexography, which is prepared by dissolving 5 to 10 percent by weight of polyimide or polyamide acid in a solvent such as butylcellosolve or n-methylpyrrolidone, the varnish is heated and hardened (baked). Then, the substrate having the polyimide film formed thereon is rubbed in a certain direction with a puff cloth made of rayon fibers so that polyimide molecules are arrayed in the certain direction near the substrate surface. Consequently, liquid crystal molecules filled in a later step are arrayed in the certain direction with the interaction between the liquid crystal molecules and the polyimide molecules.

As a result, the TFT array substrate 10 is completed.

Construction of Recesses and Projections and Recess/Projection Pattern

Figure 8:
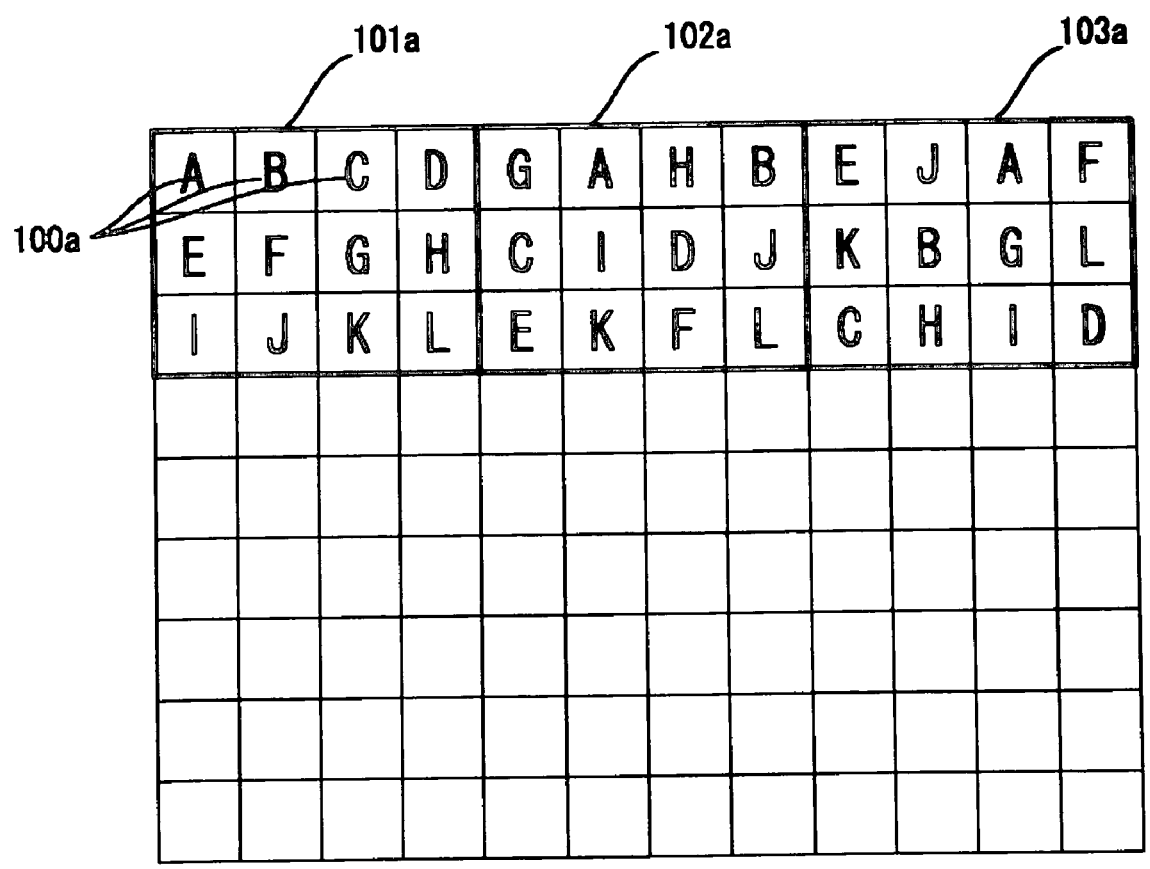
FIG. 8 is a schematic for explaining an arrangement of different recess/projection patterns for respective units of pixels in the electro-optic device to which the present invention is applied.
Figure 14A:
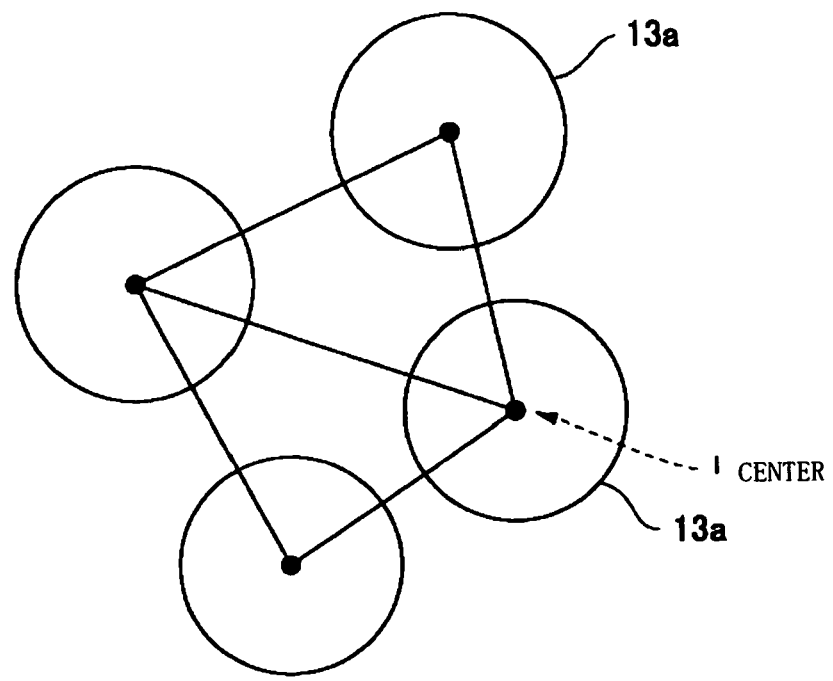
FIGS. 14(A) to 14(B) are schematics of a Delaunay triangle for evaluating relative distance relationships of recesses and projections.
Figure 14B:
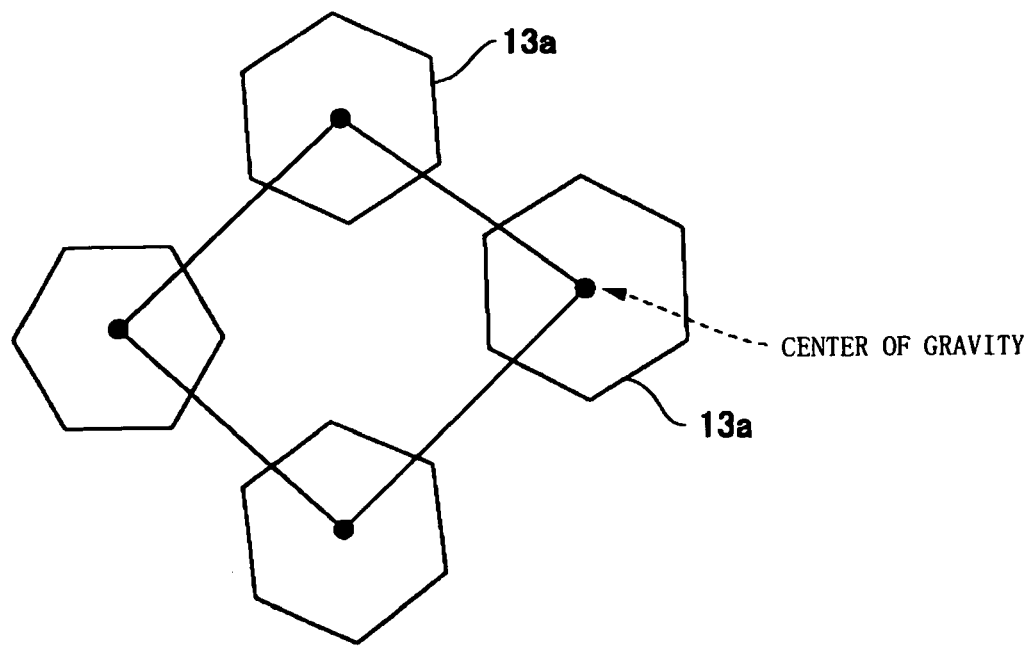

FIG. 8 is a schematic for explaining an arrangement that, when a number of pixels on the TFT array substrate are grouped into plural units, each including a plurality of pixels, the recess/projection pattern provides a different pattern for each pixel at least in each unit, and the recess/projection patterns (i.e., planar position distribution of the recesses and the projections) for the pixels at the same position in respective units differ from each other among the units. FIGS. 9, 10, 11 and 12 are explanatory views of the recess/projection pattern formed in the TFT array substrate of the electro-optic device of this exemplary embodiment. FIG. 14 is an explanatory view of a Delaunay triangle for evaluating relative distance relationships of the recesses and the projections.

In the electro-optic device 100 of this exemplary embodiment, the light reflecting film 8a of, e.g., an aluminum film is formed under the pixel electrode 9a. Therefore, a light, having entered from the side of the opposed substrate 20, is reflected by the side of the TFT array substrate 10 and then emits from the side of the opposed substrate 20. With the light modulated by the liquid crystal 50 for each pixel 100a in such an optical path, a desired image can be displayed by utilizing extraneous light (reflection mode).

Also, in this exemplary embodiment, the lower-side recess/projection forming film 13a is formed in the area under the light reflecting film 8a, in which the film 13a overlaps with the light reflecting film 8a, when viewed from above, and the recess/projection pattern 8g to scatter light is formed on the surface of the light reflecting film 8a corresponding to the recesses and the projections of the lower-side recess/projection forming film 13a. Further, in the recess/projection pattern 8g, the upper-side recess/projection forming film 7a smoothens the edges of the lower-side recess/projection forming film 13a so that no sharp edges appear. Accordingly, when an image is displayed in the reflection mode, the image is displayed with the scattered reflection lights and hence the dependency on the viewing angle is reduced.

However, if the recess/projection pattern 8g on the surface of the light reflecting film 8a is perfectly the same as each of the pixels 100a, the reflected lights from the light reflecting film 8a interfere with each other.

In this exemplary embodiment, therefore, a number of pixels 100a formed in a matrix pattern are grouped into plural units 101a, 102a, 103a . . . each including a plurality of pixels, as shown in FIG. 8. Then, at least in each of the units 101a, 102a, 103a . . . , the recess/projection pattern 8g is formed to provide a different pattern for each pixel 100a.

Stated another way, when forming the lower-side recess/projection forming film 13a in each pixel 100a, the exposure mask 510 is designed such that, for the respective pixels 100a belonging to each of the units 101a, 102a, 103a . . . , a plurality of recess/projection patterns 8g (recess/projection patterns A to L) are formed by changing planar shapes, planar sizes and/or planar position distribution of the pillar projections (asperities) formed by the lower-side recess/projection forming film 13a.

While plural kinds of recesses and projections having different planar sizes from each other are actually formed, FIGS. 4 and 5 show the recesses and the projections in the same size.

Further, positions of the recess/projection patterns A to L in the units 101a, 102a, 103a . . . are set different from each other among the units 101a, 102a, 103a . . . For example, in the first unit 101a, the recess/projection patterns A, B, C . . . are arranged in an upper stage from the left to the right in the order named. In the second unit 102a, the recess/projection patterns G, A, H . . . are arranged in an upper stage from the left to the right in the order named. In the third unit 103a, the recess/projection patterns E, J, A . . . are arranged in an upper stage from the left to the right in the order named. Thus, the recess/projection patterns (i.e., planar position distribution of the recesses and the projections) for the pixels at the same position in respective units differ from each other among the units.

Figure 9A:
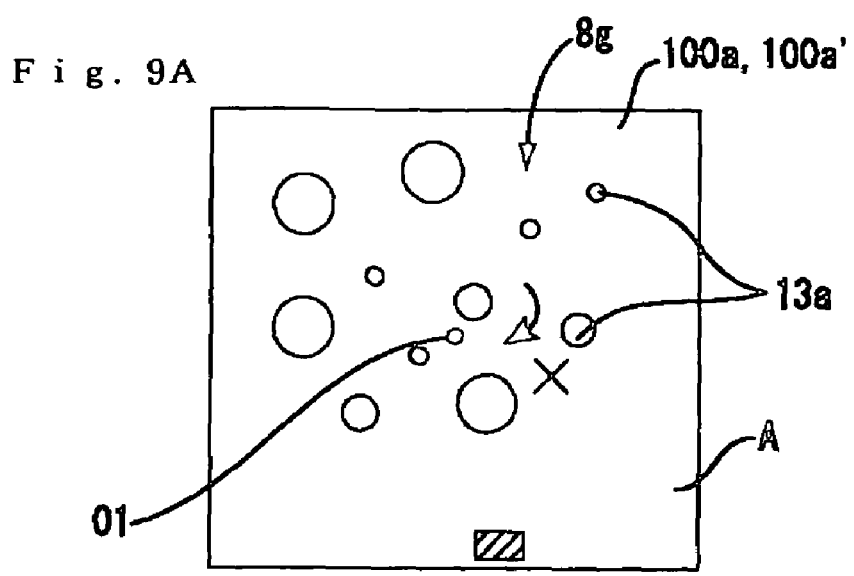
FIGS. 9(A) to 9(C) are schematics showing a difference of the recess/projection pattern formed in the pixels in the electro-optic device to which the present invention is applied.
Figure 9B:
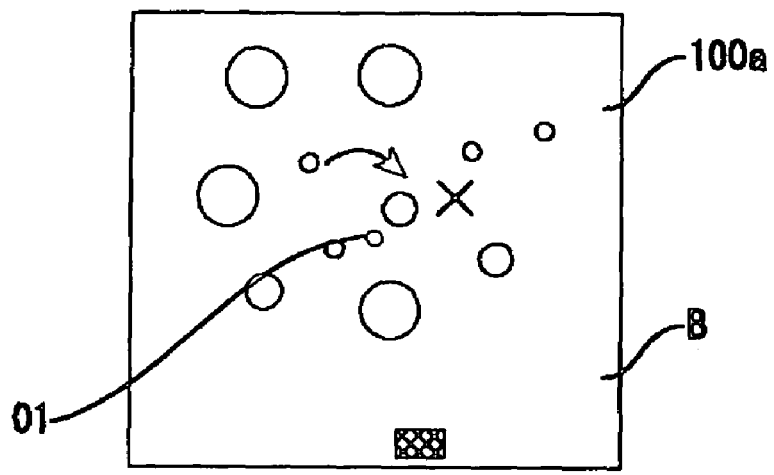
Figure 9C:
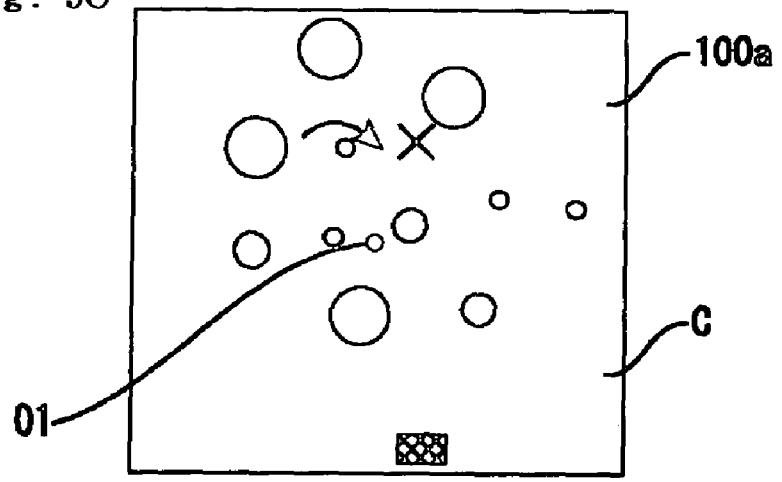

The plural kinds of recess/projection patterns are formed as follows. When forming the exposure mask 510 shown in FIG. 6(A), the pixel 100a shown in FIG. 9(A) is set as a reference pixel 100a', by way of example, in this exemplary embodiment. The recesses and the projections of the recess/projection pattern A, formed in the reference pixel 100a', are rotated about a predetermined position O1 in the pixel area, as indicated by an arrow X, to obtain the recess/projection patterns B, C . . . shown in FIGS. 9(B) and 9(C). Then, the light transmitted portions 511 of the exposure mask 510 are decided such that the recess/projection patterns B, C . . . are formed in other corresponding pixels and the different recess/projection patterns 8g are formed in the respective pixels 100a.

While the center O1 of the rotation is set within the pixel area in this exemplary embodiment, the center of the rotation is set to a position deviated from the center of the lower-side recess/projection forming film 13a which constitutes the recesses and the projections. Also, it is preferable that the center of the rotation be set to a position deviated from a circle defining an outer periphery of the lower-side recess/projection forming film 13a. With that setting, the lower-side recess/projection forming film 13a is prevented from being always formed at the position, which serves as the center of the rotation, in all the recess/projection patterns A to L.

Figure 10A:
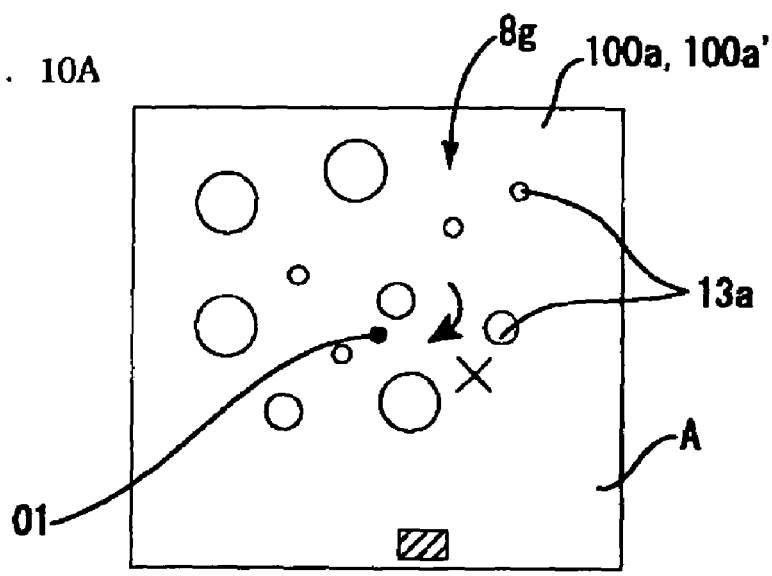
FIGS. 10(A) to 10(C) are schematics showing a difference of the recess/projection pattern formed in the pixels in the electro-optic device to which the present invention is applied.
Figure 10B:
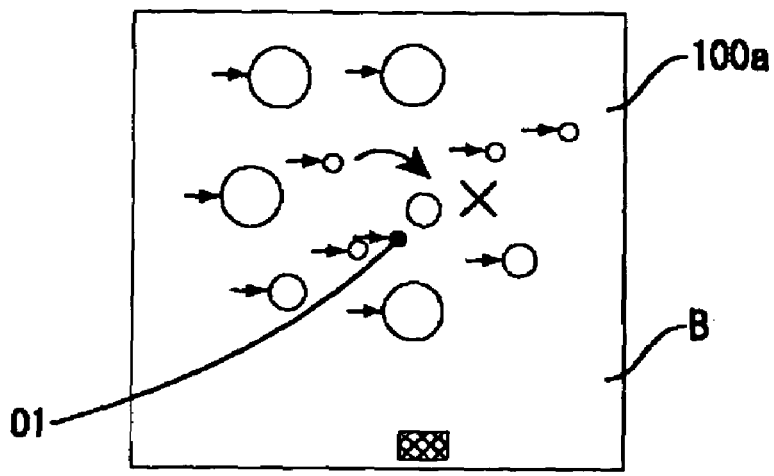
Figure 10C:
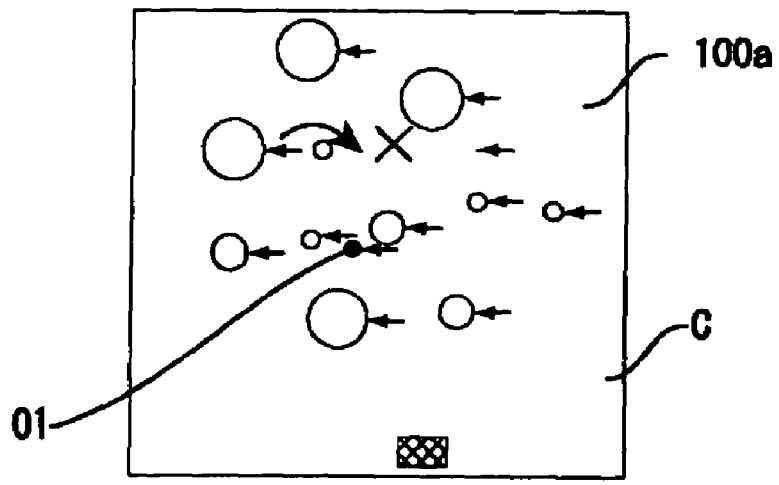

When forming the various types of recess/projection patterns with the rotation of the reference pattern, the rotation may be combined with translation of the reference pattern. In that case, positions of the recesses and the projections can be decided such that, as shown in FIG. 10(B), the reference pixel 100a' shown in FIG. 10(A) is translated by moving the center position O1 while the recess/projection pattern 8g is rotated about the position O1 as indicated by an arrow X. Then, as shown in FIG. 10(C), the reference pixel 100a' is translated in a direction opposed that in FIG. 10(B) by moving the center position O1 while the recess/projection pattern 8g is further rotated about the position O1 as indicated by an arrow X.

As another example, assuming the pixel 100a shown in FIG. 11(A) to be the reference pixel 100a', the exposure mask 510 may be designed such that the recesses and the projections of the recess/projection pattern A, formed in the reference pixel 100a', are rotated about a predetermined position O2 outside the pixel area as indicated by an arrow X, and resulting recess/projection patterns B, C . . . shown in FIGS. 11(B) and 11(C) are formed in the other corresponding pixels 100a, so that the different recess/projection patterns 8g are formed in the respective pixels 100a.

Figure 12A:
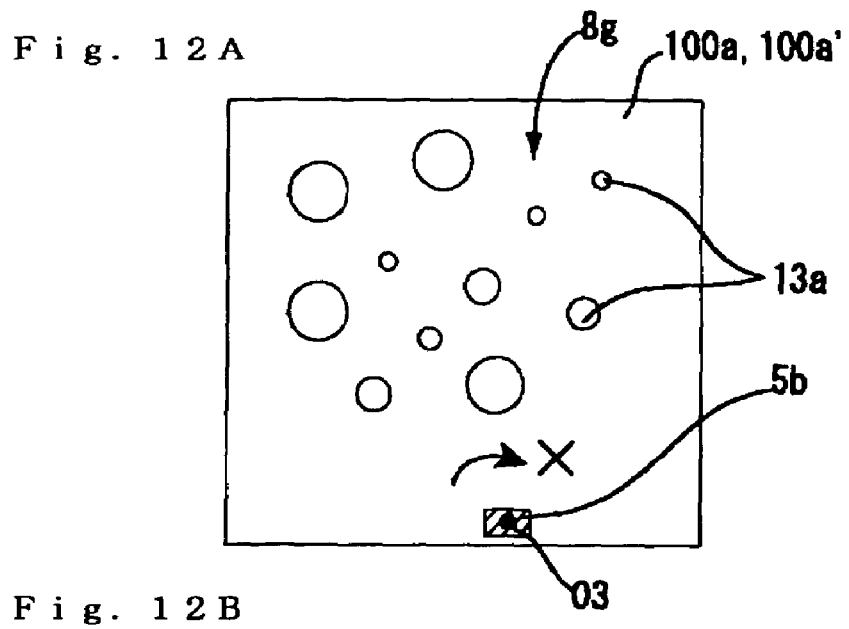
FIGS. 12(A) to 12(C) are schematics showing a difference of the recess/projection pattern formed in the pixels in the electro-optic device to which the present invention is applied.
Figure 12B:
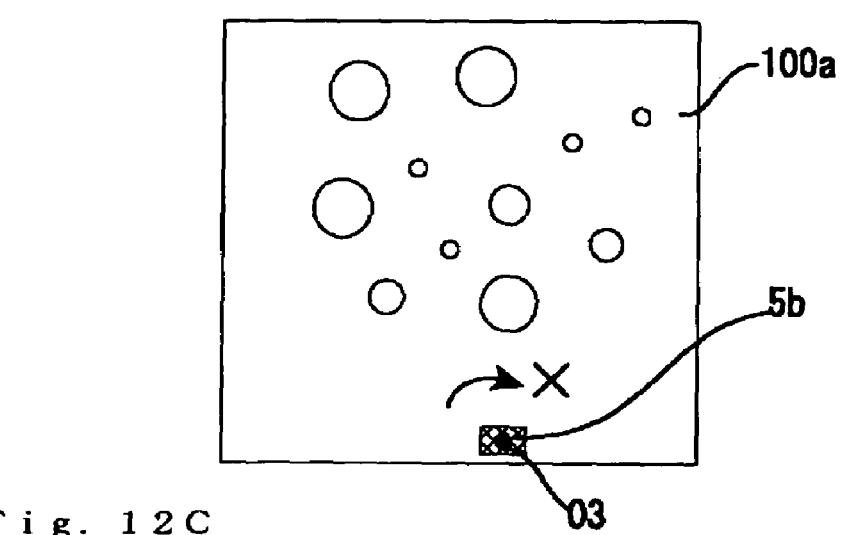
Figure 12C:
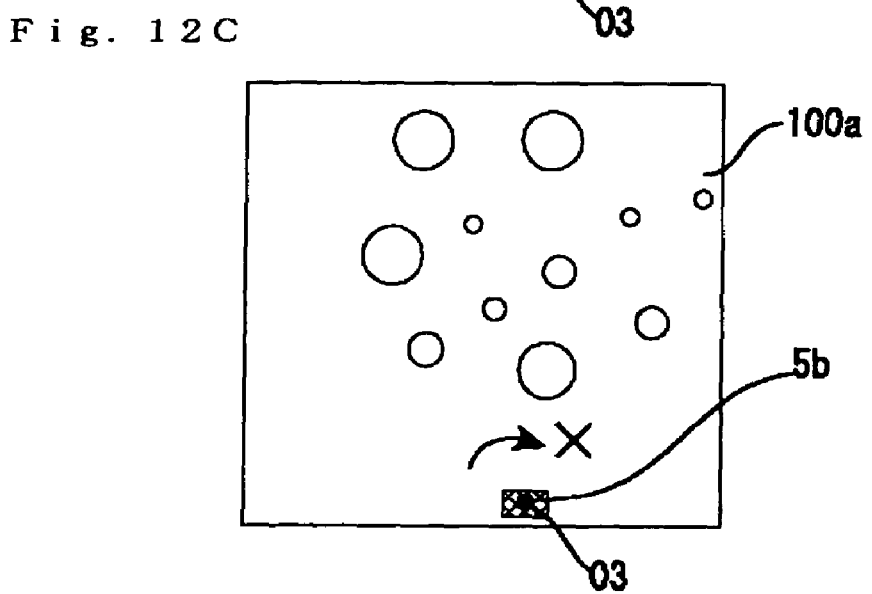

As still another example, assuming the pixel 100a shown in FIG. 12(A) to be the reference pixel 100a', the exposure mask 510 may be designed such that the recesses and the projections of the recess/projection pattern A formed in the reference pixel 100a' are rotated about a position O3 in the pixel area at which the contact hole 5b is formed, as indicated by an arrow X, and resulting recess/projection patterns B, C . . . shown in FIGS. 12(B) and 12(C) are formed in the other corresponding pixels 100a, so that the different recess/projection patterns 8g are formed in the respective pixels 100a. Also, in such a case, since the light reflecting film 8a is not formed in the contact hole 5b, as described above with reference to FIG. 5, reflected lights from the light reflecting film 8a are avoided from interfering with each other, even when the contact holes 5b repetitively appear at the same position in the respective pixels.

When carrying out the processes described above with reference to FIGS. 11 and 12, the center of the rotation may be moved while rotating the reference pattern, as described above with reference to FIG. 10, so that different recess/projection patterns are formed in the respective pixels by combination of the rotation and the translation of the reference pattern.

In the examples shown in FIGS. 9 to 12, the recesses and the projections of the recess/projection pattern A formed in the reference pixel 100a' are rotated. However, it is also possible to set, as a reference pattern, an asperity forming pattern larger than one pixel, and to decide positions of recesses and projections constituting the pattern asperities for each of the pixels by using a recess/projection pattern which is obtained by rotating the reference pattern about a predetermined position. As an alternative, it is further possible to set, as a reference pattern, an asperity forming pattern larger than a total area of the m×n number of pixels, and to decide positions of recesses and projections constituting the pattern asperities for each of the pixels by using a recess/projection pattern for the m×n number of pixels, which is obtained by rotating the reference pattern about a predetermined position.

Advantages of the Embodiment

In the electro-optic device 100 of this exemplary embodiment using the TFT array substrate 10, since the recess/projection pattern 8g is formed to provide a different pattern for each pixel 100a in each of the units 101a, 102a, 103a . . . and the position of the same recess/projection pattern 8g in each unit differs among the units 101a, 102a, 103a . . . , the same recess/projection pattern 8g is avoided from appearing repetitively in each unit and among units. It is therefore possible to reduce or prevent an interference of the reflected lights from the light reflecting film 8a.

Also, in this exemplary embodiment, when forming the recess/projection pattern 8g in a different pattern for each pixel 100a, a plurality of different recess/projection patterns 8g, obtained by rotating the recesses and the projections formed in the reference pixel 100a' about the predetermined position, are formed in the other corresponding pixels 100a.

Therefore, variations in planar shapes, planar sizes, or planar position distribution of the pillar projections formed by the lower-side recess/projection forming film 13a are controlled in each pixel 100a in this exemplary embodiment.

Stated another way, in this exemplary embodiment, the different recess/projection patterns are obtained by rotating and transferring the recesses and the projections of the reference pixel 100a'. Accordingly, variations in planar shapes, planar sizes, or planar position distribution of the lower-side recess/projection forming films 13a formed in the other pixels 100a are the same as those in the reference pixel 100a'. Hence, those variations are also small among the pixels.

For example, in this exemplary embodiment, while the plural kinds of lower-side recess/projection forming films 13a having different planar sizes are formed in one pixel, the number of the lower-side recess/projection forming films 13a having the same size in one pixel is equal among the pixels.

Figure 13A:
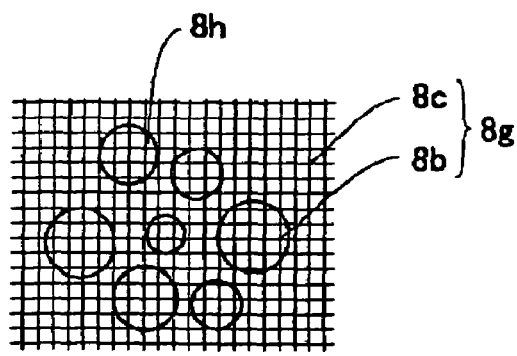
FIGS. 13(A), 13(B), 13(C) and 13(D) are respectively an explanatory view showing an area, in which the recess/projection pattern is formed and which is divided into small planes, in the electro-optic device to which the present invention is applied, an explanatory view showing an angle θ formed by each small plate relative to the substrate plane (horizontal plane), a histogram representing an existence rate of each angle θ in one pixel, and a histogram representing an existence rate of each angle θ in another pixel.
Figure 13B:
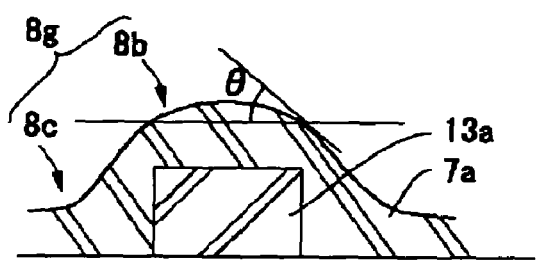
Figure 13C:
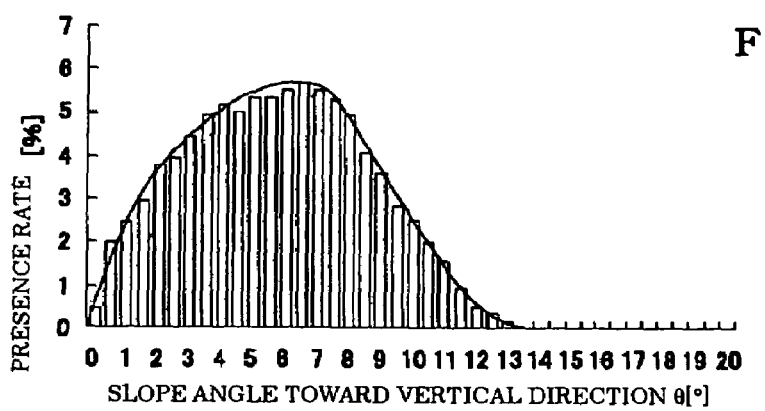
Figure 13D:
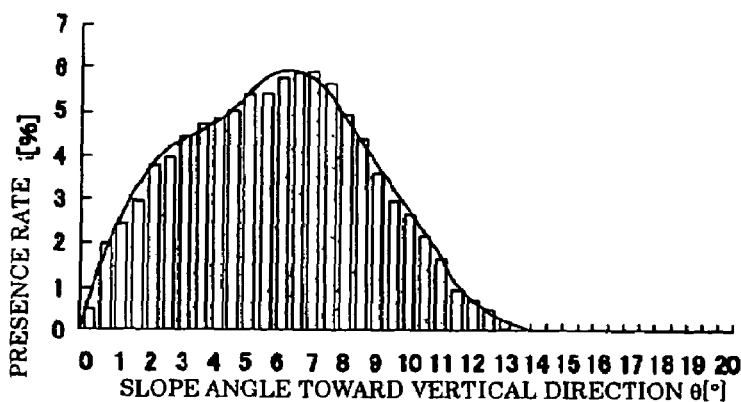

Furthermore, an area in which the recess/projection pattern 8g is formed, is divided into small planes as shown in FIG. 13(A), and an angle θ formed by each small plane 8h, relative to the substrate plane (horizontal plane), is measured as shown in FIG. 13(B). Then, by determining an existence rate of each angle θ in one pixel, the existence rate is represented in the form of a histogram as shown in FIGS. 13(C) and 13(D). As seen, there is a slight difference in histogram between the pixels. Regarding such a variation in histogram, in this exemplary embodiment, a ratio of standard deviation/average value for a total of the existence rates of the small planes, each of which has the angle θ in the range of 3° to 10°, is set to be within 10% among the pixels.

Moreover, a ratio of standard deviation/average value for a total area, in which the lower-side recess/projection forming films 13a are formed, is set to be within 5% among the pixels. In some cases, a black matrix is formed in each pixel to improve display quality. In such a case, a ratio of standard deviation/average value for a total area of the pillar projections present in the pixel area, excepting an area in which the black matrix is formed, is set to be within 5% among the pixels.

In addition, when Delaunay triangles are drawn based on respective center position coordinates of the plural lower-side recess/projection forming films 13a, as shown in FIG. 14, a ratio of standard deviation/average value of lengths of Delaunay lines is set to be not larger than 35% in any pixel.

Accordingly, when viewing the electro-optic device in a direction inclined 10 degrees to 30 degrees from the direction vertical to the TFT array substrate 10, a ratio of standard deviation/average value of reflection luminance is held within 10% among the pixels. Thus, it is possible to reduce or avoid the occurrence of glare and chrominance non-uniformity among the pixels.

Figure 15:
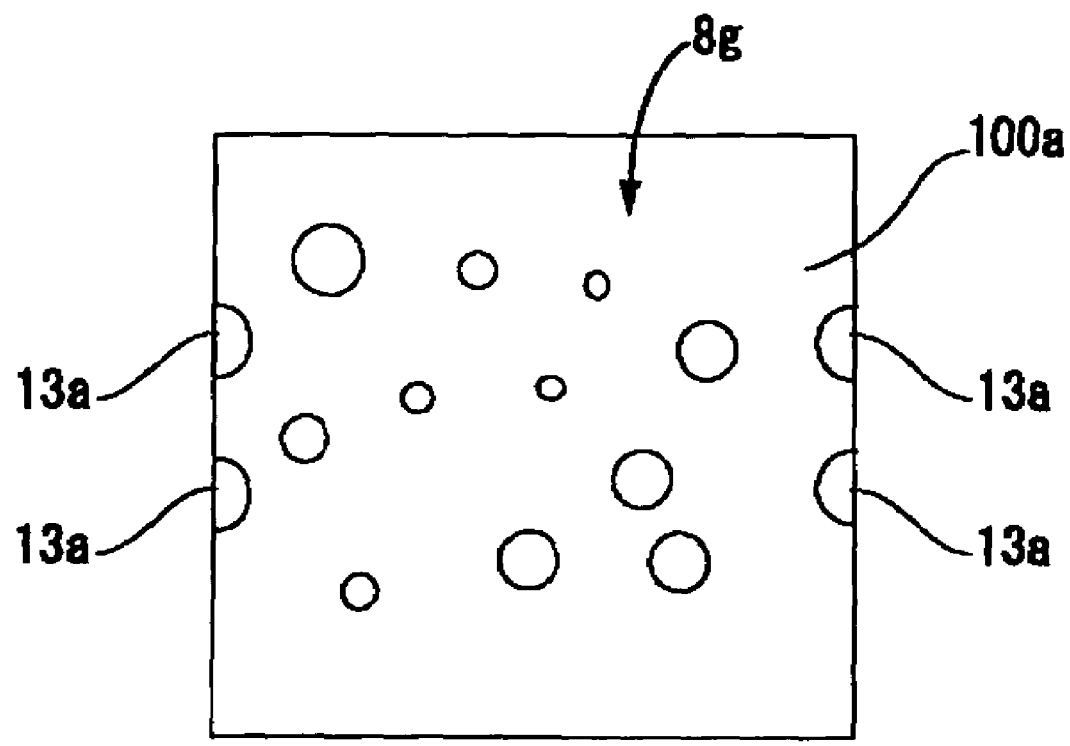
FIG. 15 is an explanatory view showing the recess/projection pattern in which recesses or projections are cut halfway at ends of the pixel.

When the recess/projection pattern includes the lower-side recess/projection forming film 13a cut halfway at the end of the pixel 100a as shown in FIG. 15, a cut portion of the film 13a is preferably formed to appear on the opposed end side of the same pixel so that a total area of the lower-side recess/projection forming films 13a is equal to integer times the normal area of the lower-side recess/projection forming film 13a having a cut size. With such an arrangement, even when the lower-side recess/projection forming film 13a is cut halfway at the ends of the pixel 100a, the number and area of the lower-side recess/projection forming films 13a formed in each pixel can be held substantially the same.

Other Exemplary Embodiments

Figure 16:
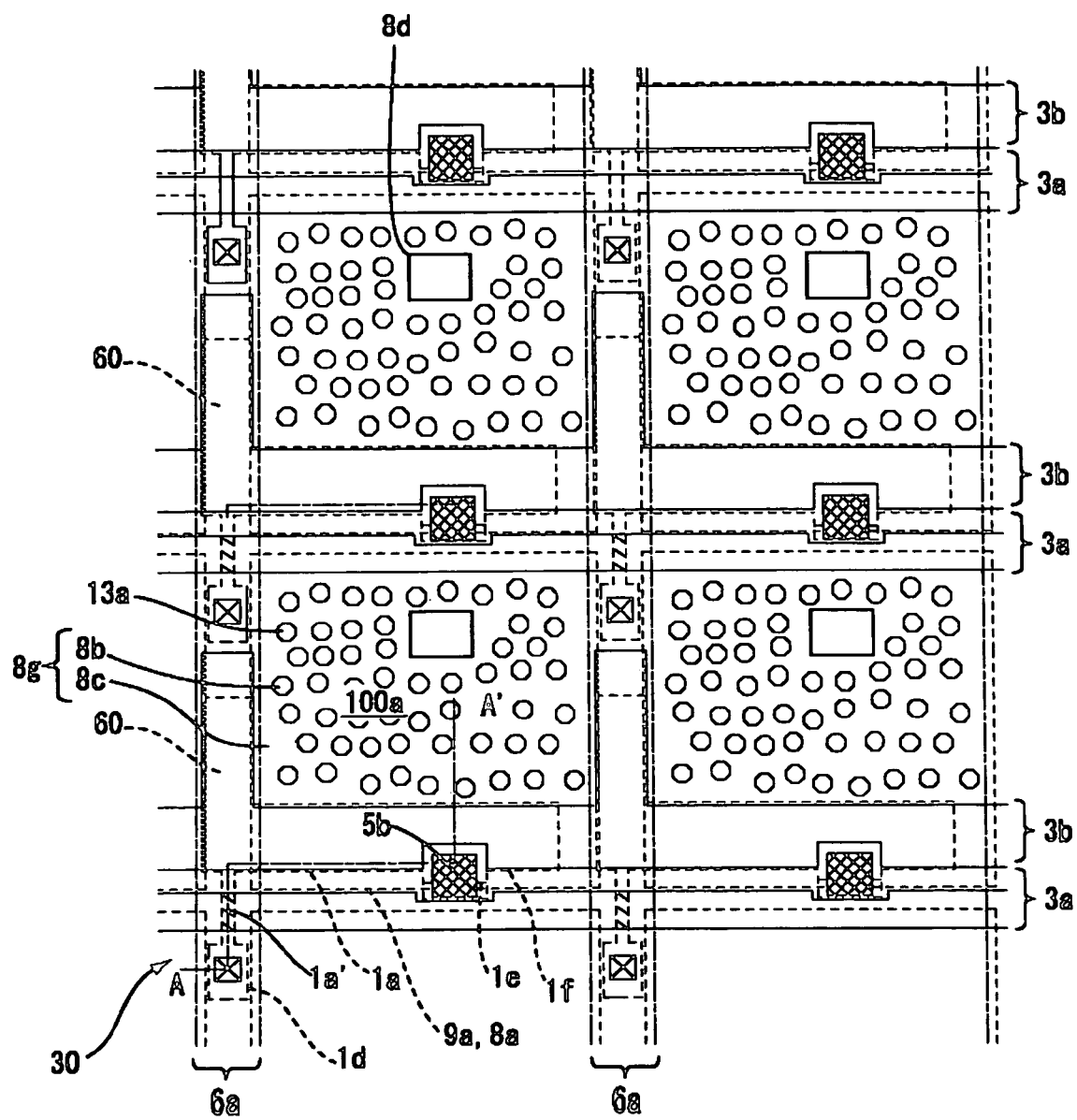
FIG. 16 is an explanatory view for explaining a restriction imposed on the center of rotation of a reference pattern when different recess/projection patterns are formed in the pixels in a transflective electro-optic device.

In the case of rotating the recess/projection pattern in the above-described exemplary embodiments, as shown in FIGS. 9 to 12, when a light passing window 8d to display an image in the transmission mode is formed in the light reflecting film 8*a* as shown in FIG. 16, the center of the rotation of the recess/projection pattern 8*g* is preferably set in the light passing window 8*d*. With such an arrangement, because the light reflecting film 8*a* is not formed in the light passing window 8*d*, reflected lights from the light reflecting film 8*a* are reduced or avoided from interfering with each other, even if the light passing windows 8*d* repetitively appear at the same position in the respective pixels.

Figure 17:
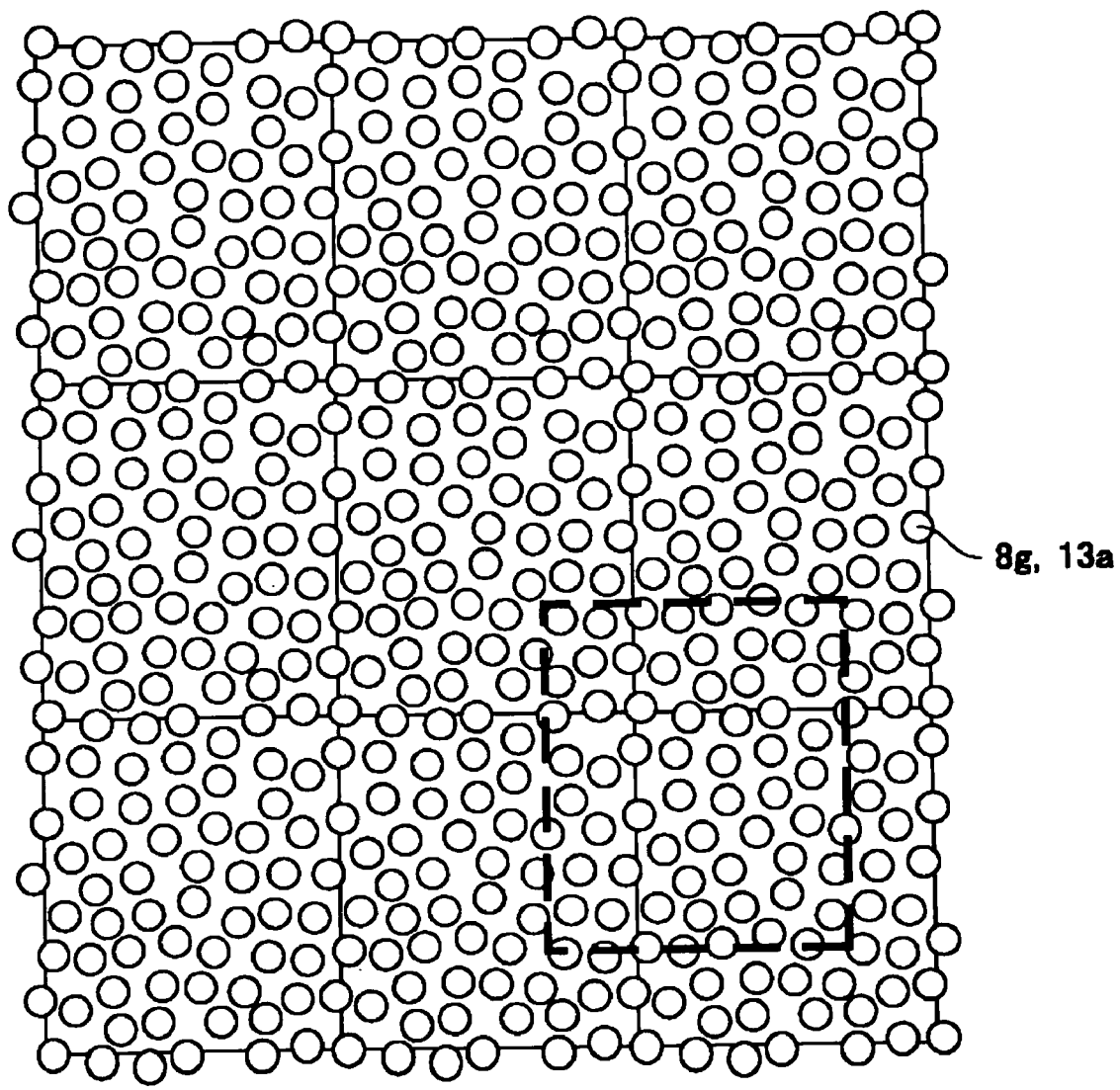
FIG. 17 is an explanatory view showing the case of forming different kinds of recess/projection patterns by translation operation in the electro-optic device to which the present invention is applied.

Also, the method of obtaining different recess/projection patterns is not limited to the above-described one of rotating the recess/projection pattern as shown in FIGS. 9 to 12, and the recess/projection pattern may be translated. Specifically, as shown in FIG. 17, reference patterns having continuous patterns at respective upper, lower, right and left boundaries are closely arranged side by side in number, e.g., nine, and different patterns are cut out from an overall pattern from different positions while moving a cutting-out frame (denoted by dotted lines) of the same area as the reference pattern. According to this method, each pattern cut out at any position has continuity in all of the up and down directions and the right and left directions. Further, each pattern in the cutting-out frame provides a pattern having coordinates obtained by translating the coordinates of the reference pattern. The size of the cutting-out frame is not limited to the size of one pixel, but it may cover several pixels depending on the size of the reference pattern.

While the above exemplary embodiment has been described, by way of example, as forming the lower-side recess/projection forming film 13*a* to provide the pillar projections each having a circular plan shape, the pillar projections may have a hexagonal, octagonal or other suitable polygonal plan shape. In consideration of mask data and scattering characteristics, however, the plan shape of the pillar projections is preferably circular, regular hexagonal, or regular octagonal. Further, instead of forming the pillar projections by the lower-side recess/projection forming film 13*a*, the asperities may be obtained by coating the lower-side recess/projection forming film 13*a* over substantially the overall substrate surface and forming recesses in the lower-side recess/projection forming film 13*a*.

While, in the above exemplary embodiment, the recess/projection pattern is formed to provide a different pattern for each pixel in each of the divided area units and the position of the same recess/projection pattern in each unit differs among the units, the recess/projection pattern may be formed to provide different patterns for each of a number of pixels.

Additionally, the above exemplary embodiment has been described, by way of example, in connection with an active matrix liquid crystal device using a TFT as a pixel switching device. However, the present invention is also applicable to any of an active matrix liquid crystal device using a TFD as a pixel switching device, a passive matrix liquid crystal device, and electro-optic devices utilizing electro-optic materials other than the liquid crystal.

(Application of Electro-Optic Device to Electronic Apparatus)

The reflective or transflective electro-optic device 100, having the above-described construction, can be employed as a display in various types of electronic apparatuses. Some examples of those electronic apparatuses will be described with reference to FIGS. 18, 19(A) and 19(B).

Figure 18:
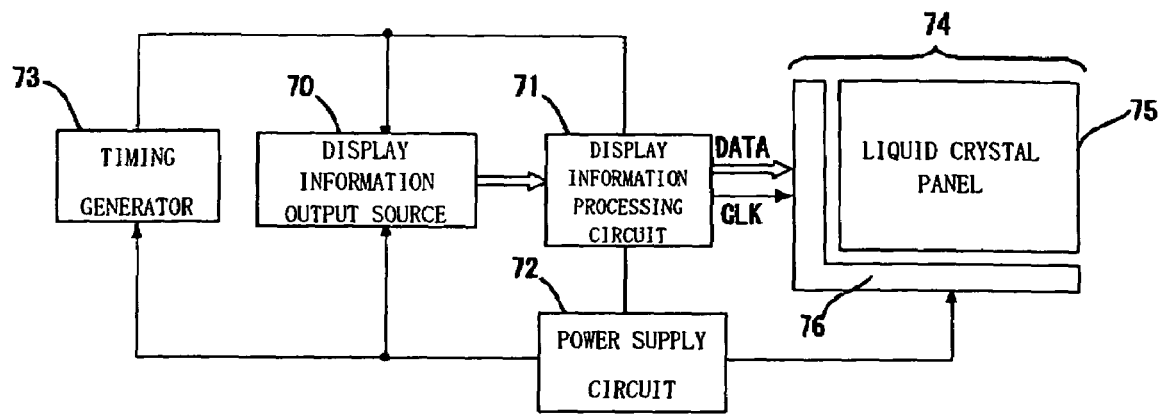
FIG. 18 is a block schematic showing a circuit configuration of an electronic apparatus using, as a display, the electro-optic device according to the present invention.

FIG. 18 is a block schematic showing a circuit configuration of an electronic apparatus using, as a display, the electro-optic device according to the present invention.

Referring to FIG. 18, the electronic apparatus includes a display information output source 70, a display information processing circuit 71, a power supply circuit 72, a timing generator 73, and a liquid crystal device 74. The liquid crystal device 74 includes a liquid crystal display panel 75 and a driving circuit 76. The liquid crystal device 74 can be constituted by using the electro-optic device 100 described above.

The display information output source 70 includes memories such as a ROM (Read Only Memory) and a RAM (Random Access Memory), a storage unit such as any of various disks, a tuning circuit for tuning and outputting a digital image signal, and so on. In accordance with various clock signals created by the timing generator 73, the display information output source 70 supplies display information, e.g., an image signal in a predetermined format, to the display information processing circuit 71.

The display information processing circuit 71 includes known various circuits, such as a serial-parallel conversion circuit, an amplification/reversing circuit, a rotation circuit, a gamma correction circuit, and a clamping circuit. The display information processing circuit 71 executes processing of the input display information and supplies a processed image signal to the driving circuit 76 together with a clock signal CLK. The power supply circuit 72 supplies predetermined voltages to the corresponding components.

Figure 19A:
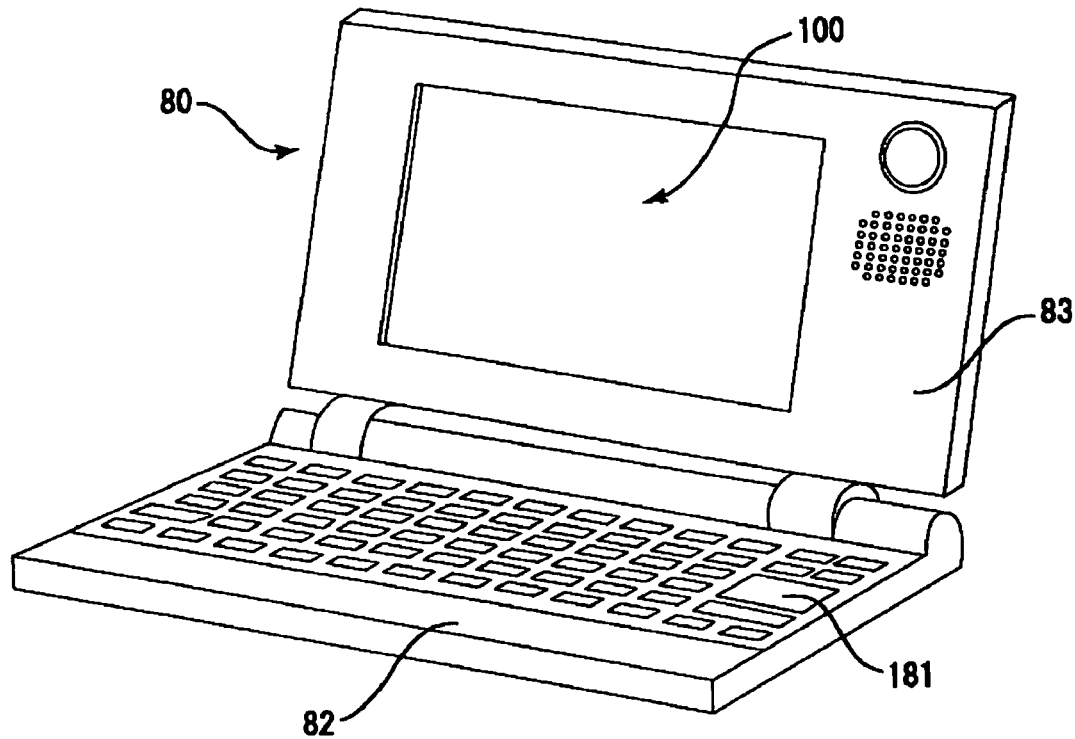
FIGS. 19(A) and 19(B) are explanatory views showing respectively, a mobile personal computer and a cellular phone as examples of an electronic apparatus using the electro-optic device according to the present invention.

FIG. 19(A) shows a mobile personal computer as one example of the electronic apparatus, according to the present invention. A personal computer 80 shown in FIG. 19(A) includes a body unit 82 provided with a keyboard 81, and a liquid crystal display unit 83. The liquid crystal display unit 83 is constituted including the electro-optic device 100 described above.

Figure 19B:
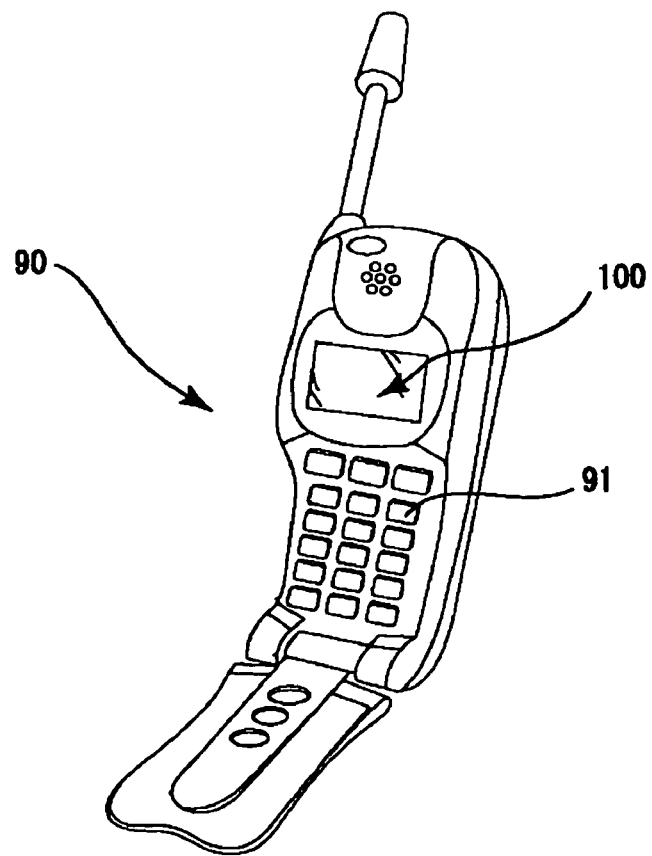
Figure 20:
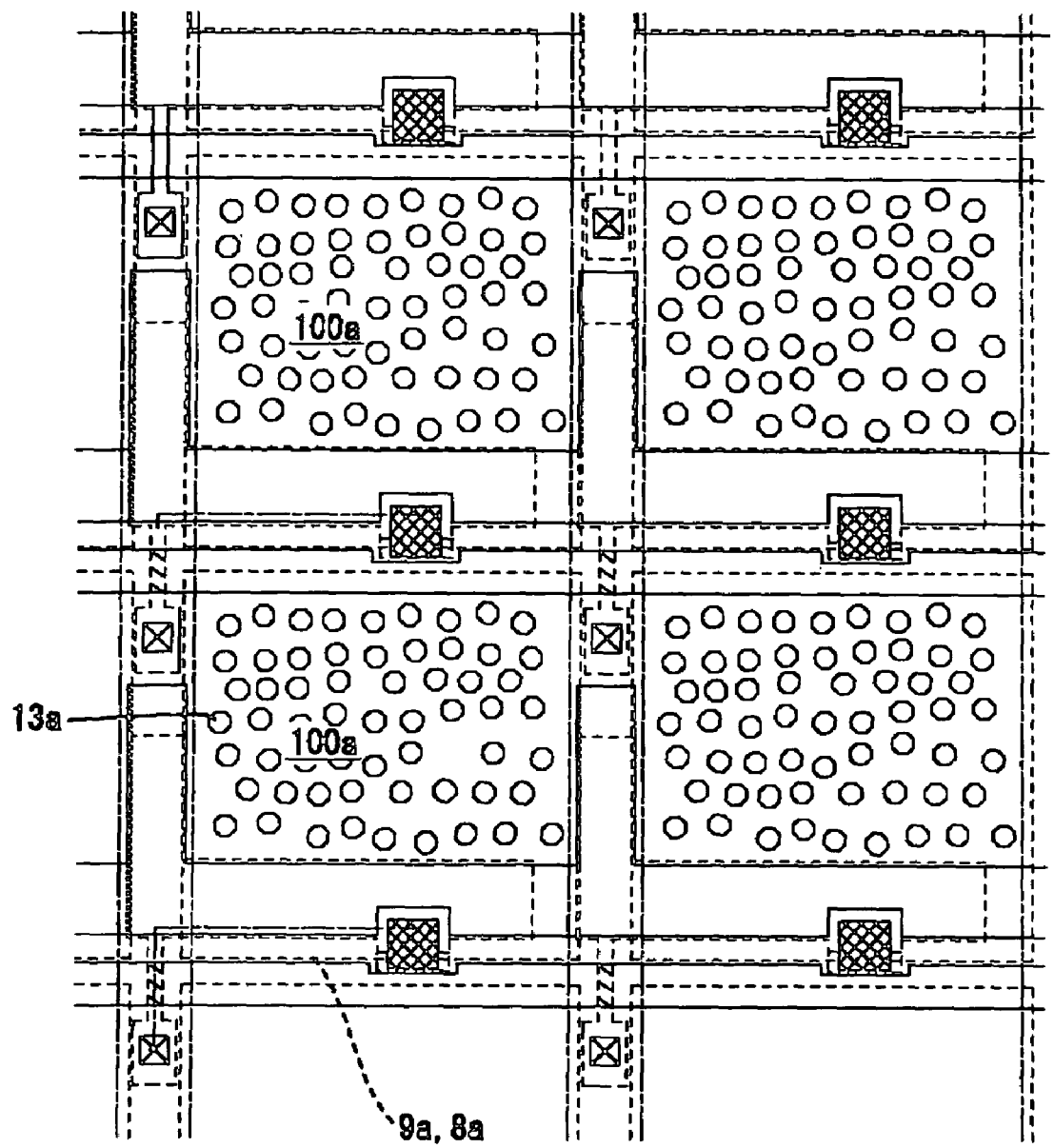
FIG. 20 is a plan view of pixels in a TFT array substrate using a related art electro-optic device.
Figure 21:
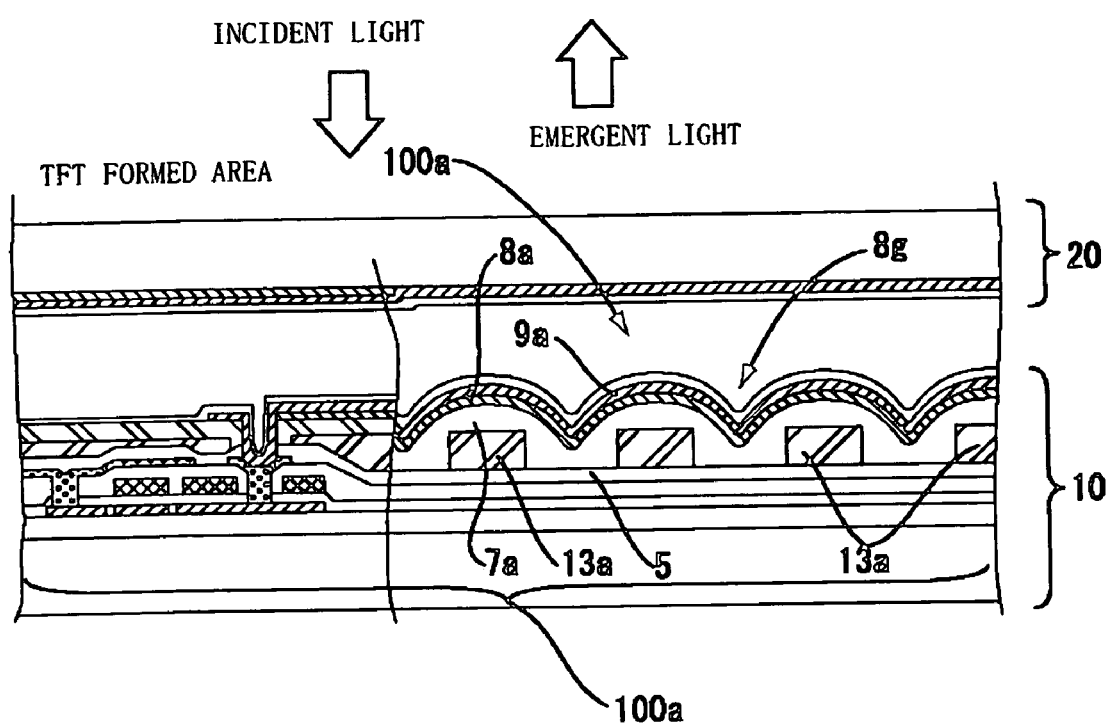
FIG. 21 is a partial sectional view of the pixel in the related art electro-optic device.

FIG. 19(B) shows a cellular phone as another example of the electronic apparatus, according to the present invention. A cellular phone 90 shown in FIG. 19(B) includes a plurality of operating buttons 91 and a display constituted by the electro-optic device 100 described above.

Advantages

According to the present invention, as described above, since the recess/projection pattern is formed to provide a different pattern for each pixel in each of the divided area units and the position of the same recess/projection pattern in each unit differs among the units, the same recess/projection pattern is avoided from appearing repetitively in each unit and among units. It is therefore possible to reduce or prevent an interference of the reflected lights from the light reflecting film. Furthermore, since variations in shapes, sizes, or position distribution of the asperities are controlled in the recess/projection pattern, it is possible to avoid the occurrence of glare and chrominance non-uniformity among the pixels.

What is claimed is:

1. An electro-optic device, comprising:
   a recess/projection forming layer having asperities formed in a dispersed condition; a multiplicity of pixels formed in a matrix pattern on a substrate for holding an electro-optic material; and
   a light reflecting film formed above said recess/projection forming layer being disposed in each of the multiplicity of pixels, and said recess/projection forming layer forming a recess/projection pattern to scatter light on a surface of said light reflecting film,
   the multiplicity of pixels being grouped into plural units each including a plurality of pixels, the recess/projection pattern being formed to provide a different pattern for each pixel at least in each of the units and the recess/projection pattern for the pixel at the same position in each unit differing among the units, an asperity forming pattern larger than one pixel being set as a reference pattern, and positions of the projections and the recesses constituting said asperities for each of the pixels being decided using a recess/projection pattern which is obtained by rotating the reference pattern about a predetermined position, said light reflecting film being electrically connected to a lower or upper conductive layer through a contact hole and being formed except for said contact hole, and the center of rotation of the reference pattern being set to a position overlapping with said contact hole.

2. The electro-optic device according to claim 1, the projections or the recesses constituting said asperities having a circular or polygonal plan shape.

3. The electro-optic device according to claim 1, when viewing said electro-optic device in a direction inclined 10 degrees to 30 degrees from the direction vertical to said substrate, a ratio of standard deviationlaverage value of reflection luminance being within 10% among the pixels.

4. The electro-optic device according to claim 1, the projections or the recesses constituting said asperities being formed in plural kinds having different planar sizes in one pixel.

5. The electro-optic device according to claim 4, the projections or the recesses constituting said asperities being formed such that the number of the projections or the recesses having the same planar size in one pixel being equal among the pixels.

6. The electro-optic device according to claim 1, an area in which the recess/projection pattern being formed being divided into small planes and an existence rate of small planes having respective angles, which are formed by the small planes relative to the substrate plane, in one pixel being represented in the form of a histogram, a ratio of standard deviationlaverage value for a total of the existence rates of the small planes, in each of which said angle being in the range of 3° to 10° being within 10% among the pixels.

7. The electro-optic device according to claim 1, a ratio of standard deviation/average value for a total area of the projections or the recesses constituting said asperities being within 5% among the pixels.

8. The electro-optic device according to claim 1, a ratio of standard deviation/average value for a total area of those of the projections or the recesses constituting said asperities, which are present in a pixel area excepting an area where a black matrix is formed, being within 5% among the pixels.

9. The electro-optic device according to claim 1, when Delaunay triangles are drawn based on respective center position coordinates of the projections or the recesses constituting said asperities, a ratio of standard deviation/average value of lengths of Delaunay lines being not larger than 35%.

10. The electro-optic device according to claim 1, a total area of those of the projections or the recesses constituting said asperities, which are cut halfway at ends of each pixel, being equal to integer times normal areas of those recesses or projections.

11. The electro-optic device according to claim 1, an overlap rate of the projections or the recesses constituting said asperities among the pixels being not smaller than 50%.

12. The electro-optic device according to claim 1, the asperity forming pattern being larger than a total area of a m=n number of pixels, where m=number of columns and n=number of rows.

13. The electro-optic device according to claim 1 different recess/projection patterns being formed in the respective pixels by moving the center of rotation of the reference pattern while the reference pattern is rotated.

14. The electro-optic device according to claim 1 the center of rotation of the reference pattern being set to a position deviated from the projections or the recesses constituting said asperities.

15. The electro-optic device according to claim 1, a rectangular area made up of recess/projection patterns having continuity in patterns at respective left and right ends and continuity in patterns at respective upper and lower ends being set as a basic pattern, and positions of the projections and the recesses constituting said asperities for the respective pixels being decided using a plurality of recess/projection patterns which are obtained by translating a region to cut out each of the recess/projection patterns from said basic pattern up, down, rightward or leftward while maintaining continuity in patterns at ends of said cutting-out region.

16. The electro-optic device according to claim 15, said cutting-out region covering several pixels.

17. The electro-optic device according to claim 15, said cutting-out region covering one pixel, and a size of said cutting-out region corresponding to an aperture area of the pixel excepting an area in which a light shield film is formed.

18. The electro-optic device according to claim 1, said substrate being prepared as a first substrate, a second substrate being arranged in an opposed relation to said first substrate, and a liquid crystal being held as said electro-optic material between both said substrates.

19. An electronic apparatus including, as a display, the electro-optic device according to claim 1.

20. An electro-optic device, comprising:

a recess/projection forming layer having asperities formed in a dispersed condition; a multiplicity of pixels formed in a matrix pattern on a substrate for holding an electro-optic material; and a light reflecting film formed above said recess/projection forming layer being disposed in each of the multiplicity of pixels formed in a matrix pattern on a substrate for holding an electro-optic material, and said recess/projection forming layer forming a recess/projection pattern to scatter light on a surface of said light reflecting film, the multiplicity of pixels being grouped into plural units each including a plurality of pixels, the recess/projection pattern being formed to provide a different pattern for each pixel at least in each of the units and the recess/projection pattern for the pixel at the same position in each unit differing among the units.

an asperity forming pattern larger than one pixel being set as a reference pattern, and positions of the projections and the recesses constituting said asperities for each of the pixels being decided using a recess/projection pattern which is obtained by rotating the reference pattern about a predetermined position. and said light reflecting film having a light passing window formed therein to display an image in a transmission mode, and the center of rotation of the reference pattern is set in said light passing window.

* * * * *